US009876104B2

(12) United States Patent
Matocha et al.

(10) Patent No.: US 9,876,104 B2
(45) Date of Patent: Jan. 23, 2018

(54) HIGH VOLTAGE SEMICONDUCTOR DEVICES AND METHODS OF MAKING THE DEVICES

(71) Applicant: Monolith Semiconductor Inc., Round Rock, TX (US)

(72) Inventors: Kevin Matocha, Round Rock, TX (US); Kiran Chatty, Round Rock, TX (US); Sujit Banerjee, Round Rock, TX (US)

(73) Assignee: Monolith Semiconductor Inc., Round Rock, TX (US)

(*) Notice: Subject to any disclaimer, the term of this patent is extended or adjusted under 35 U.S.C. 154(b) by 0 days.

(21) Appl. No.: 15/412,462

(22) Filed: Jan. 23, 2017

(65) Prior Publication Data

US 2017/0133503 A1    May 11, 2017

Related U.S. Application Data

(63) Continuation of application No. 14/619,742, filed on Feb. 11, 2015, now Pat. No. 9,583,482.

(51) Int. Cl.
*H01L 29/78* (2006.01)
*H01L 29/16* (2006.01)
(Continued)

(52) U.S. Cl.
CPC ........ *H01L 29/7806* (2013.01); *H01L 21/046* (2013.01); *H01L 21/8213* (2013.01);
(Continued)

(58) Field of Classification Search
None
See application file for complete search history.

(56) References Cited

U.S. PATENT DOCUMENTS

| 4,811,065 A | * | 3/1989 | Cogan | ................. H01L 27/0727 |
|---|---|---|---|---|
| | | | | 257/328 |
| 4,823,172 A | * | 4/1989 | Mihara | ............. H01L 29/41766 |
| | | | | 257/144 |

(Continued)

OTHER PUBLICATIONS

Xu, Jing, "Technology for Planar Power Semiconductor Device Package with Improved Voltage Rating" Virginia Polytechnic Institute and State University, Diss. 2008.*

(Continued)

*Primary Examiner* — Joseph Schoenholtz
(74) *Attorney, Agent, or Firm* — Maier & Maier, PLLC

(57) ABSTRACT

A multi-cell MOSFET device including a MOSFET cell with an integrated Schottky diode is provided. The MOSFET includes n-type source regions formed in p-type well regions which are formed in an n-type drift layer. A p-type body contact region is formed on the periphery of the MOSFET. The source metallization of the device forms a Schottky contact with an n-type semiconductor region adjacent the p-type body contact region of the device. Vias can be formed through a dielectric material covering the source ohmic contacts and/or Schottky region of the device and the source metallization can be formed in the vias. The n-type semiconductor region forming the Schottky contact and/or the n-type source regions can be a single continuous region or a plurality of discontinuous regions alternating with discontinuous p-type body contact regions. The device can be a SiC device. Methods of making the device are also provided.

10 Claims, 26 Drawing Sheets

(51) Int. Cl.
*H01L 29/66* (2006.01)
*H01L 21/04* (2006.01)
*H01L 27/07* (2006.01)
*H01L 29/06* (2006.01)
*H01L 29/10* (2006.01)
*H01L 21/82* (2006.01)
*H01L 29/872* (2006.01)
*H01L 27/06* (2006.01)

(52) U.S. Cl.
CPC ...... *H01L 27/0629* (2013.01); *H01L 27/0727* (2013.01); *H01L 29/0696* (2013.01); *H01L 29/1095* (2013.01); *H01L 29/1608* (2013.01); *H01L 29/66068* (2013.01); *H01L 29/872* (2013.01)

(56) References Cited

U.S. PATENT DOCUMENTS

| | | | |
|---|---|---|---|
| 4,967,243 A | 10/1990 | Baliga | |
| 5,111,253 A | 5/1992 | Korman | |
| 5,410,170 A * | 4/1995 | Bulucea | H01L 29/0696 257/330 |
| 5,693,569 A | 12/1997 | Ueno | |
| 6,351,018 B1 | 2/2002 | Sapp | |
| 6,621,107 B2 * | 9/2003 | Blanchard | H01L 29/7806 257/155 |
| 6,979,863 B2 | 12/2005 | Ryu | |
| 7,118,970 B2 * | 10/2006 | Das | H01L 29/1095 257/328 |
| 7,126,169 B2 * | 10/2006 | Kitabatake | H01L 27/0629 257/187 |
| 7,453,119 B2 | 11/2008 | Bhalla | |
| 7,923,320 B2 * | 4/2011 | Ryu | H01L 21/8213 257/302 |
| 7,928,470 B2 * | 4/2011 | Yamaguchi | H01L 29/0634 257/135 |
| 8,274,113 B1 | 9/2012 | Hsieh | |
| 8,680,587 B2 * | 3/2014 | Henning | H01L 29/8611 257/155 |
| 2004/0212011 A1 * | 10/2004 | Ryu | H01L 29/872 257/335 |
| 2005/0082640 A1 * | 4/2005 | Takei | H01L 29/0696 257/545 |
| 2007/0262410 A1 * | 11/2007 | Ono | H01L 27/0727 257/499 |
| 2008/0014693 A1 * | 1/2008 | Matocha | H01L 29/1608 438/238 |
| 2008/0029812 A1 | 2/2008 | Bhalla | |
| 2008/0048257 A1 * | 2/2008 | de Fresart | H01L 29/0634 257/341 |
| 2009/0173949 A1 | 7/2009 | Yatsuo | |
| 2010/0109077 A1 | 5/2010 | Banerjee | |
| 2010/0200931 A1 * | 8/2010 | Matocha | H01L 21/0465 257/401 |
| 2011/0298016 A1 | 12/2011 | Li | |
| 2012/0223339 A1 | 9/2012 | Mizukami | |
| 2012/0261715 A1 | 10/2012 | Kim | |
| 2013/0034941 A1 * | 2/2013 | Dhar | H01L 21/3115 438/285 |
| 2013/0075808 A1 | 3/2013 | Calafut | |
| 2013/0126971 A1 * | 5/2013 | Arthur | H01L 29/66068 257/337 |
| 2013/0256698 A1 * | 10/2013 | Sdrulla | H01L 21/049 257/77 |
| 2013/0277740 A1 * | 10/2013 | Guan | H01L 29/0634 257/342 |
| 2013/0313570 A1 * | 11/2013 | Sdrulla | H01L 29/7806 257/77 |
| 2014/0001528 A1 * | 1/2014 | Pfirsch | H01L 29/0634 257/300 |
| 2014/0027781 A1 * | 1/2014 | Ryu | H01L 29/7811 257/77 |
| 2014/0133104 A1 | 5/2014 | Delgado | |
| 2015/0084062 A1 * | 3/2015 | Pala | H01L 21/046 257/77 |
| 2015/0084063 A1 * | 3/2015 | Van Brunt | H01L 29/66143 257/77 |
| 2015/0084118 A1 | 3/2015 | Van Brunt | |
| 2015/0084119 A1 | 3/2015 | Pala | |
| 2015/0084125 A1 | 3/2015 | Pala | |
| 2015/0145030 A1 * | 5/2015 | Meiser | H01L 29/7825 257/334 |
| 2015/0221731 A1 * | 8/2015 | Zeng | H01L 29/407 257/139 |
| 2015/0279983 A1 * | 10/2015 | Tanaka | H01L 29/7806 257/329 |
| 2015/0287668 A1 | 10/2015 | Gatterbauer | |

OTHER PUBLICATIONS

Gladish, J., "MOSFET Selection to Minimize Losses in Low-Output-Voltage DC-DC Converters", Fairchild Semiconductor Power Seminars, 2008-2009 pp. 1-23.*
Podgaynaya, A.; Pogany, D.; Gornik, E.; Stecher, M., "Improvement of the electrical safe operating area of a DMOS transistor during ESD events," in Reliability Physics Symposium, 2009 IEEE International , pp. 437-442, Apr. 26-30, 2009.*
International Search Report dated Jun. 13, 2016 in International Application No. PCT/US2016/017518.
Written Opinion of the International Searching Authority dated Jun. 13, 2016 in International Application No. PCT/US2016/017518.
Xu, Jing, "Technology for Planar Power Semiconductor Device Package with Improved Voltage Rating," Virginia Polytechnic Institute and State University, Dissertation (Dec. 2008).
Stevanovic, L., "Packaging Challenges and Solutions for Silicon Carbide Power Electronics", Electronic Components and Technology Conference, San Diego, CA (May 29, 2012).
Le Gouic, B., "New Strategies for Thermal Management of High Power Modules and Systems", Yole Development, Semicon West, San Francisco, CA (Jul. 12-14, 2011).
Baliga, B., "Paradigm Shift in Planar Power MOSFET Technology", Power Electronics Technology, pp. 24-32 (Nov. 2003).
Gladish, J., "MOSFET Selection to Minimize Losses in Low-Output-Voltage DC-DC Converters", Fairchild Semiconductor Power Seminars 2008-2009, pp. 1-23.
Podgaynaya et al., "Improvement of the electrical safe operating area of a DMOS transistor during ESD events", in Reliability Physics Symposium, 2009 IEEE International, pp. 437-442 (Apr. 26-30, 2009).
Radhakrishnan et al., "Influence of Anode Layout on the Performance of SiC JBS Diodes", Materials Science Forum, MSF 717-720, pp. 937-940 (May 2012).
Lien et al., "4H-SiC N-Channel JFET for Operation in High Temperature Environments", J. Electron Devices Society, vol. 2, No. 6, pp. 164-167 (Sep. 2014).
Definition of "adjacent" from URL < http://www.merriam-webster.com/dictionary/adjacent > on Apr. 23, 2016.

* cited by examiner

HIGH VOLTAGE SEMICONDUCTOR DEVICES AND METHODS OF MAKING THE DEVICES

CROSS-REFERENCE TO RELATED CASES

This application is a continuation of U.S. patent application Ser. No. 14/619,742, filed on Feb. 11, 2015, pending, which is incorporated by reference herein in its entirety.

STATEMENT REGARDING FEDERALLY SPONSORED RESEARCH

This invention was made with government support under Grant No. DE-AR0000442 awarded by the Department of Energy. The government has certain rights in the invention.

BACKGROUND

Field

This application relates generally to high voltage semiconductor devices and methods of making the devices and, in particular, to high voltage semiconductor devices comprising an integrated diode and methods of making the devices.

Background of the Technology

Metal oxide semiconductor field-effect transistors (i.e., MOSFETs) are commonly used in power electronic circuits such as DC to DC converters. DC-DC converters use power MOSFET based switches to convert voltage from one level to another level. In a typical DC to DC converter, a control circuit drives the gates of two power MOSFETs to regulate the transfer of power from the supply to a load. One of the power MOSFETs may be operated as a synchronous rectifier.

The properties of silicon carbide are ideally suited for high-voltage power electronic applications such as power MOSFETs for DC-DC converters. One of the main advantages of silicon carbide over silicon is its higher critical breakdown field strength. Silicon carbide has breakdown field strength of approximately 3 MV/cm compared to approximately 0.3 MV/cm for silicon. The 10× higher breakdown field strength of silicon carbide enables semiconductor switches and rectifiers with higher reverse blocking voltages and lower on state resistance enabling superior power electronic system performance than possible with silicon.

In a DC-DC converter, the power MOSFETs need to be turned off for a short period of time while one MOSFET is turning on and the other is turning off to prevent shoot through current between supply and ground. During this dead time, the p-n junction diode integral to the power MOSFET structure can conduct current. Current conduction through the p-n junction diodes integral to SiC MOSFETs is not preferred due to higher conduction power losses compared to Schottky diodes. The higher conduction power loss of SiC p-n junction diodes is the result of a higher turn on voltage and therefore a larger forward voltage drop of the diodes. P-n junction diodes also have a higher switching power loss since it is a bipolar device and stores minority carriers that need to be removed for the diode to turn off.

For this reason, a Schottky diode can be connected anti-parallel with the SiC power MOSFET as a freewheeling diode (D1) in the DC-DC converter circuit. The Schottky diode has a lower turn on voltage (approximately 0.9 V) and therefore has a lower conduction loss compared to the integral p-n junction diode with a forward voltage drop of approximately 3.5V. Also, a Schottky diode is a majority carrier devices, so the switching power losses are also lower compared to p-n junction diodes since there is no storage of minority carriers in the device.

While freewheeling Schottky diodes can be added to the converter circuit to improve the conversion efficiency, the use of an external Schottky diode increases the cost of the converter unit due to the need for an additional component. External Schottky diodes also take up room on the board which hinders achieving a smaller converter footprint. The reliability of the Schottky diode and its electrical connections on the board also may reduce the overall reliability of the converter. In addition, the wire-bonds in the Schottky diode result in additional inductance which will play a role in limiting the high frequency operation of the converter.

Accordingly, there still exists a need for MOSFET devices, particularly SiC MOSFET devices, wherein a Schottky diode is integrated within the power MOSFET structure.

SUMMARY

A multi-cell MOSFET device is provided which comprises:
  an n-type drift layer on an n-type substrate;
  a plurality of MOSFET cells, each of the MOSFET cells comprising:
    first and second p-type well regions in spaced relation on the n-type drift layer;
    an n-type JFET region on the n-type drift layer between the first and second p-type well regions, wherein each of the first and second p-type well regions has an channel region adjacent the JFET region;
    first and second n-type source regions on each of the first and second p-type well regions and adjacent the channel regions opposite the JFET region, wherein the first and second n-type source regions have a higher dopant concentration than the n-type drift layer;
    source ohmic contacts on each of the first and second n-type source regions;
    a gate dielectric layer on the JFET region and channel regions;
    a gate layer on the gate dielectric layer;
    an interlayer dielectric layer on the gate layer; and
    first and second p-type body contact regions on the n-type drift layer and adjacent the first and second n-type source regions opposite the channel regions, wherein the first and second p-type body contact regions have a higher dopant concentration than the first and second p-type well regions;
  an n-type Schottky region on the n-type drift layer adjacent one or more of the MOSFET cells;
  a source metal layer on and in contact with the source ohmic contacts; and
  a Schottky metal layer on and in contact with the n-type Schottky region, the Schottky metal layer forming a Schottky contact with the n-type Schottky region.

A method of making a multi-cell MOSFET device is also provided which comprises:
  forming first and second p-type well regions in an n-type drift layer, wherein the n-type drift layer is on an n-type substrate and wherein the first and second p-type well regions are spaced apart forming an n-type Schottky region therebetween and wherein an n-type region of the drift layer adjacent each of the first and second well regions and opposite the n-type Schottky region forms first and second JFET regions;

forming n-type source regions in each of the first and second p-type well regions, wherein the n-type source regions are spaced from the first and second JFET regions leaving a p-type channel region between the n-type source regions and the JFET regions;

forming first and second p-type body contact regions between the Schottky region and each of the first and second p-type well regions, respectively;

depositing a gate oxide layer on the first and second JFET regions and on adjacent channel regions;

depositing a gate layer on the gate oxide layer;

depositing an interlayer dielectric material on the gate layer;

forming source ohmic contacts on the source regions;

depositing a source metal layer on the source ohmic contacts and on the n-type Schottky region, wherein the source metal layer forms a Schottky contact with the n-type Schottky region; and depositing final metal on the source metal layer.

A method of making a multi-cell MOSFET device is also provided which comprises:

etching into an n-type drift layer to form first and second openings having a bottom and sidewalls, wherein the n-type drift layer is on an n-type substrate and wherein the first and second openings are spaced apart forming an n-type Schottky region therebetween;

forming first and second p-type well regions in the n-type drift layer adjacent the first and second openings, respectively, wherein the first and second p-type well regions are formed opposite the n-type Schottky region and wherein an n-type region of the drift layer adjacent the first and second well regions forms first and second JFET regions;

forming n-type source regions in each of the first and second p-type well regions, wherein the n-type source regions are spaced from the first and second JFET regions leaving a p-type channel region between the n-type source regions and the JFET regions;

forming first and second p-type body contact regions adjacent the bottom and sidewalls of the first and second openings;

depositing dielectric material in the first and second openings;

depositing a gate oxide layer on the first and second JFET regions and on adjacent channel regions;

depositing a gate layer on the gate oxide layer;

depositing an interlayer dielectric material on the gate layer;

forming source ohmic contacts on the source regions;

depositing a source metal layer on the source ohmic contacts and on the n-type Schottky region, wherein the source metal layer forms a Schottky contact with the n-type Schottky region; and depositing final metal on the source metal layer.

A multi-cell MOSFET device is also provided which comprises:

a first MOSFET cell and an adjacent second MOSFET cell: and a perimeter region comprising a plurality of alternating p-type body contact regions and n-type Schottky regions between the first and second MOSFET cells.

According to some embodiments, the perimeter region further comprises a first p-type body contact region extending along a perimeter of the first MOSFET cell adjacent the perimeter region and a second p-type body contact region extending along a perimeter of the second MOSFET cell adjacent the perimeter region and opposite the first p-type body contact region and the alternating p-type body contact regions extend between the first and second p-type body contact regions. According to some embodiments, the first MOSFET cell comprises a plurality of alternating p-type body contact regions and n-type source regions extending along a perimeter of the first MOSFET cell adjacent the perimeter region and the second MOSFET cell comprises a plurality of alternating p-type body contact regions and n-type source regions extending along a perimeter of the second MOSFET cell adjacent the perimeter region.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF THE VARIOUS EMBODIMENTS

Figure 1A:
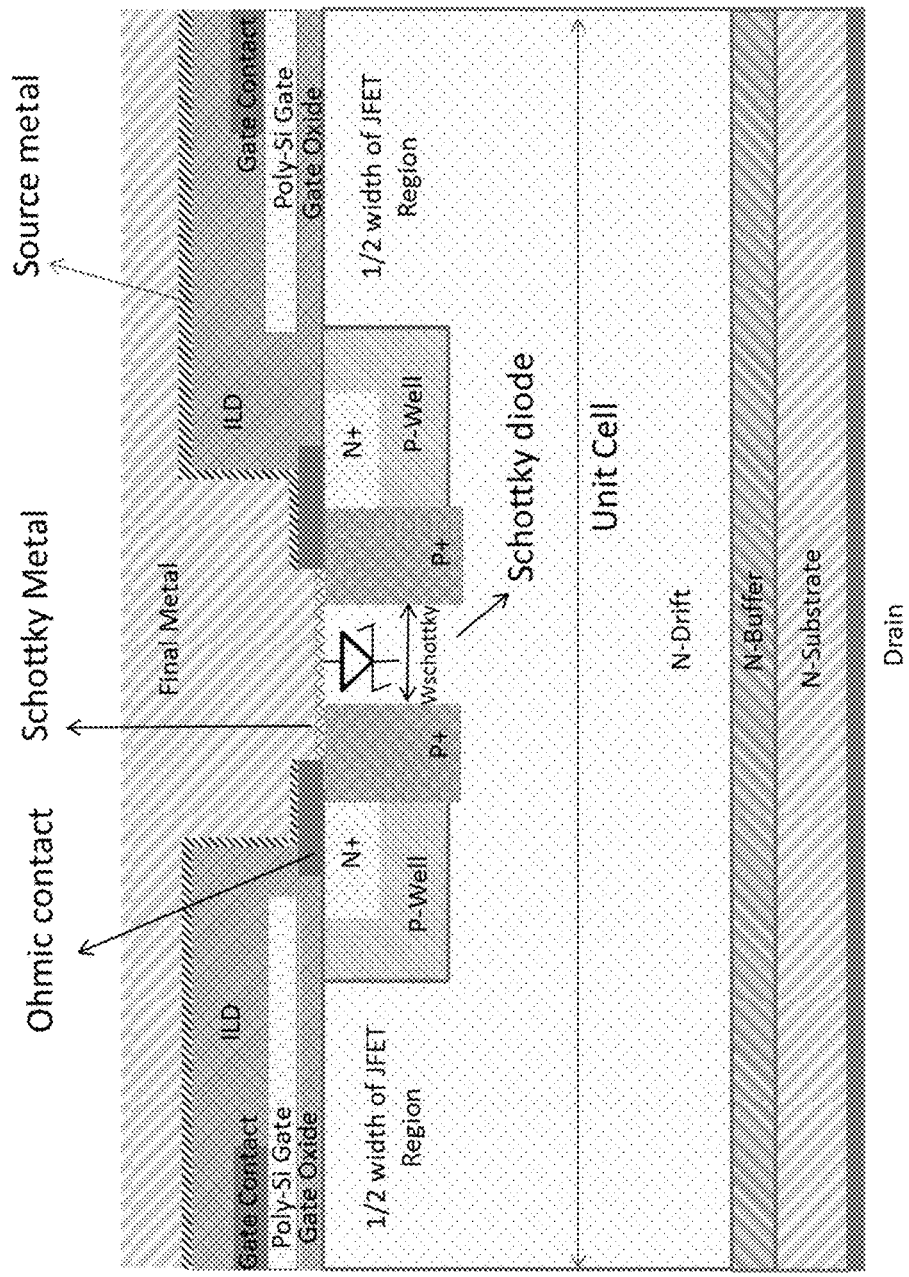
FIG. 1A is a schematic cross-sectional view of a multi-cell MOSFET semiconductor device comprising an integrated Schottky diode.

As used herein, a "perimeter region" of a cell is a region at or near the perimeter of the cell. According to some embodiments, a perimeter region of a cell can be adjacent the perimeter of the cell.

As used herein, a layer that is "on" an underlying layer can be in direct contact with the underlying layer or in indirect contact with the underlying layer wherein one or more intervening layers are between the layer and the underlying layer.

Metal oxide semiconductor field-effect transistor (MOSFET) devices can be used in power electronic circuits such as DC to DC converters. A commonly used power semiconductor switch is the Double Diffused MOSFET or DMOSFET. Diffusion refers to the manufacturing process. In particular, the P wells and N source regions are obtained by a double diffusion process (i.e., diffusion of the p-type wells followed by diffusion on the n-type source regions).

Since diffusion of dopants is negligible in SiC, dopants are introduced into SiC via an ion implantation process. For this reason, SiC DMOSFETs are referred to as Double Ion Implanted MOSFETs. The conventional SiC DMOSFET device comprises two P-type well regions implanted in an n-type drift layer on an N-type substrate. The n-type material between the p-type well regions forms the JFET region of the device. N+ source regions are implanted in the p-type well regions and offset from the inner edge of the p-type well region. This offset forms the channel regions of the device. A refractory gate electrode is formed over the JFET and channel regions.

In a multi-cell DMOSFET device, a plurality of spaced p-type well regions and N+ source regions are implanted in a drift layer. P+ body contact regions are implanted through the N+ source regions and underlying p-type well regions to form separate source/well regions for adjacent cells. In the multi-cell device, the width of the unit cell (i.e., the cell pitch) is defined as the center to center distance between adjacent JFET regions. A smaller cell pitch is generally desirable to ensure a large packing density of DMOS cells in a given area. The cells may be stripes, "ladder" type or "3DMOS" designs.

During on-state of the DMOSFET, the application of a gate bias greater than the threshold voltage results in current flow from the drain terminal of the device to the source terminal of the device. During the off-state of the DMOSFET, the drain terminal is biased at high voltage (for example, the drain to source voltage can be at 1200 volts), the gate and source terminals are biased at the ground potential corresponding to 0 volts. The large reverse voltage is supported by the depletion region of the P-N junction diode formed by P-well to N-drift regions. The DMOSFET has a built-in P-N junction diode formed between the P-well to N-drift regions. Under certain operating conditions, the P-N junction diode is forward biased and conducts current. As set forth above, current conduction through the p-n junction diodes integral to SiC MOSFETs is not preferred due to higher conduction and switching power losses compared to Schottky diodes. Accordingly, different device structures and layouts that allow the integration of the Schottky diode within a MOSFET structure are provided.

According to some embodiments, a MOSFET with an integrated Schottky diode is provided wherein the source metallization of the device also forms the Schottky contact. FIG. 1A is a schematic cross-sectional view of a unit cell of a multi-cell device of this type. As can be seen from FIG. 1A, the MOSFET device comprises a Schottky diode between adjacent MOSFET cells. As shown in FIG. 1A, the Schottky diode is formed between the Schottky metal and the N-type drift region and is surrounded by body contact (P+) regions on either side. The Schottky metal is deposited over the N-type drift region to form the Schottky contact. Source metal is deposited on the ohmic contacts to form the source contacts. The final source metal is then deposited on and in contact with the source metal and Schottky metal. The Schottky metal and the source metal can be the same or different materials. The body contact (P+) regions surrounding the Schottky diode can shield the Schottky region from the high electric fields when the MOSFET is in a reverse blocking mode and a high voltage (for example 1200 V) is applied on the drain terminal. The body contact (P+) regions can also play a role in reducing the leakage current of the Schottky diode under reverse blocking state of the MOSFET. The cell pitch of the device is defined as the distance between the middle of the JFET region of one MOSFET cell to the middle of the JFET region of an adjacent MOSFET cell.

Figure 1B:
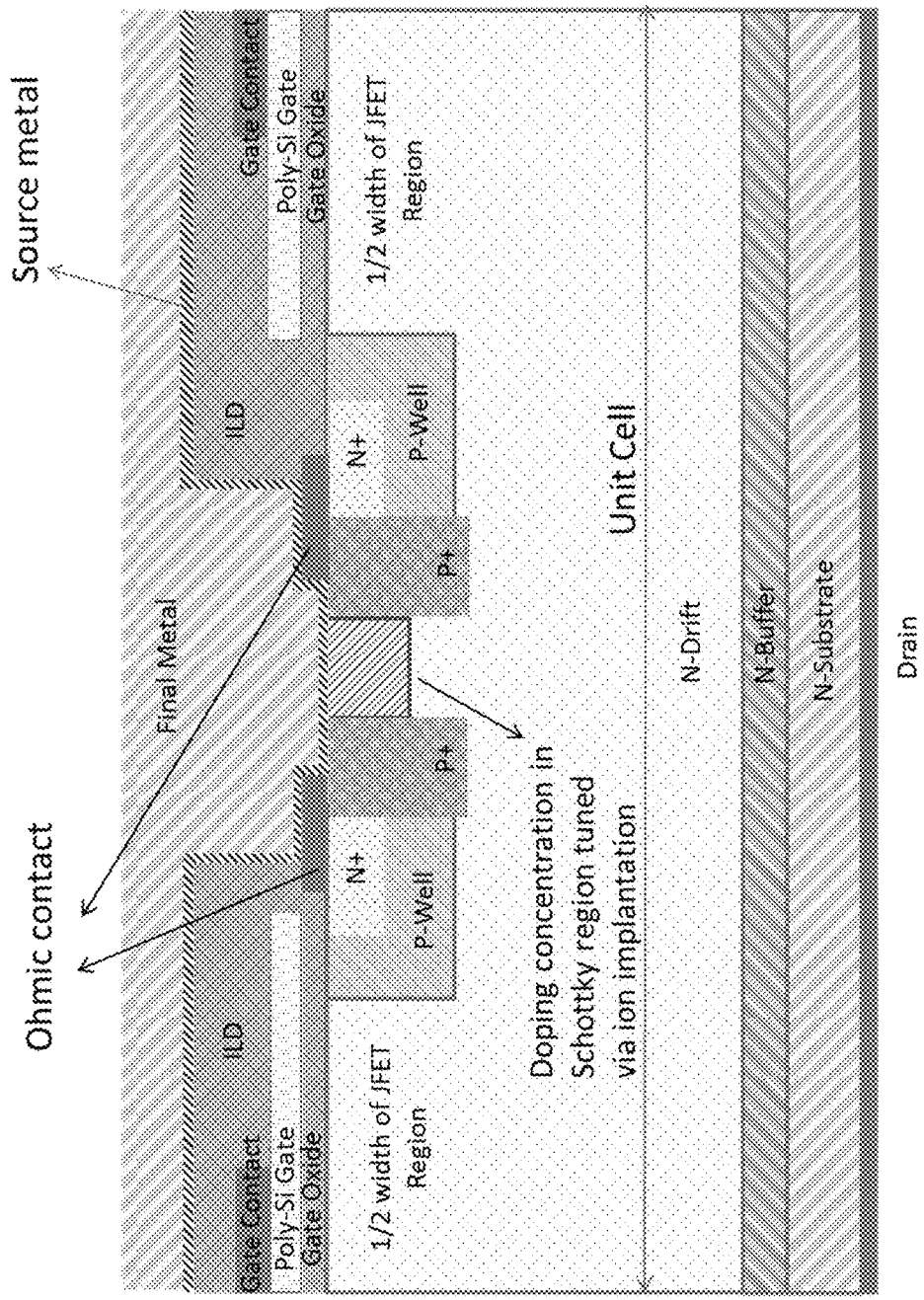
FIG. 1B is a schematic cross-sectional view of a multi-cell MOSFET semiconductor device comprising an integrated Schottky diode wherein the Schottky region of the device has a different doping concentration than the drift layer.

The doping concentration in the Schottky region can be different than the doping concentration of the N-type drift region. A schematic of a device having a different net doping concentration in the Schottky region than the drift region is depicted in FIG. 1B. In According to some embodiments, the doping concentration in the Schottky region can be $5 \times 10^{15}$ to $5.0 \times 10^{16}$ cm$^{-3}$. According to some embodiments, the Schottky region can be counter doped so that the doping concentration in the Schottky region is lower than the N-drift doping concentration. Counter doping may be used to lower electric fields during reverse blocking state. According to some embodiments, the doping concentration in the Schottky region can be higher than the doping concentration of the N-drift region. This may be done to lower the diode forward voltage drop.

Figure 1C:
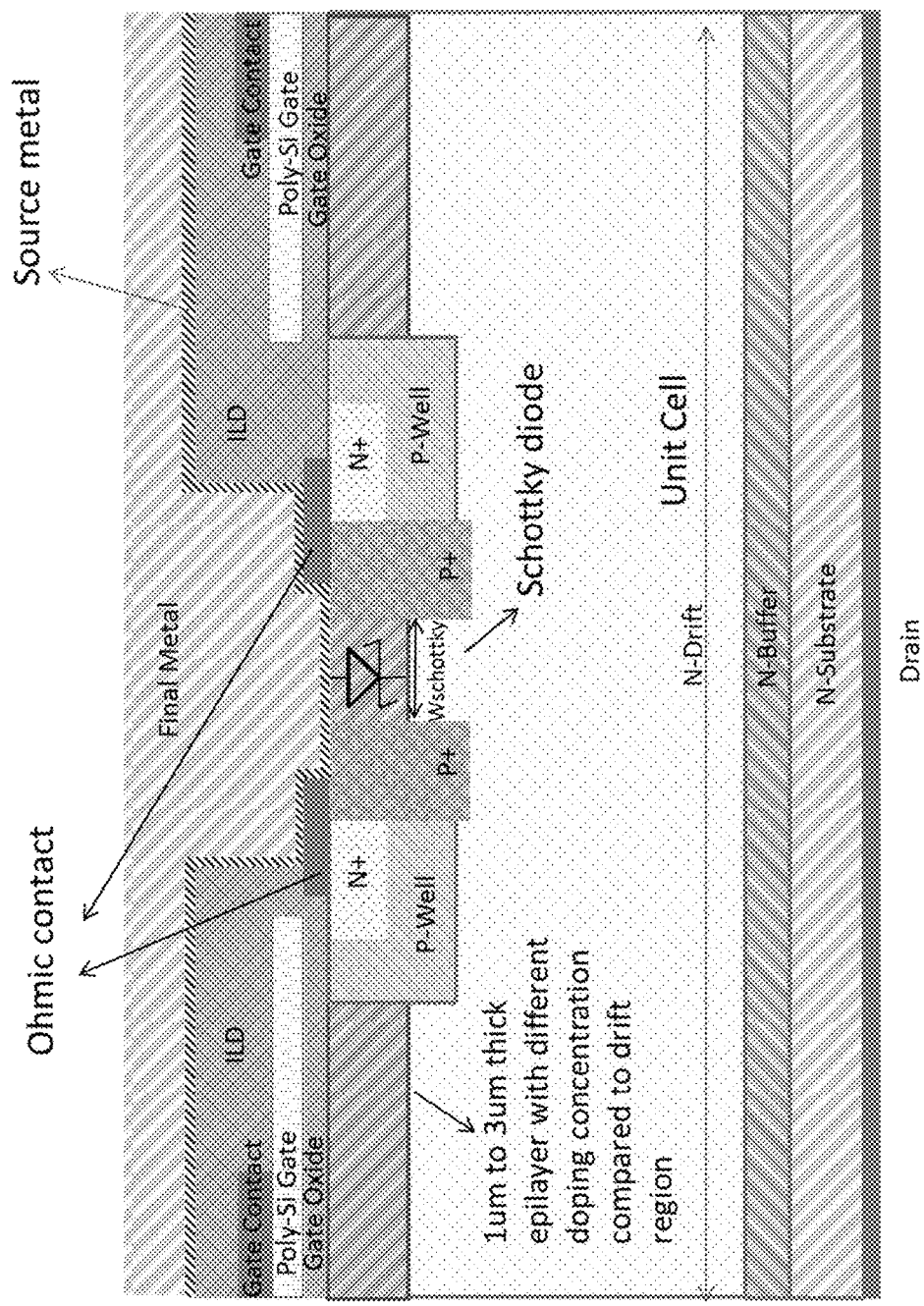
FIG. 1C is a schematic cross-sectional view of a multi-cell MOSFET semiconductor device comprising an integrated Schottky diode wherein the Schottky and JFET regions of the device have a different doping concentration than the drift layer.

The JFET region of the MOSFET device can also have a different doping concentration than the drift layer. According to some embodiments, the JFET region and the Schottky region can each have a different doping concentration that is also different than the doping concentration of the drift layer. For example, the JFET region doping concentration and the Schottky region doping concentration may be defined independently via ion implantation. According to some embodiments, an n-type epitaxial layer (i.e., epilayer) can be grown over the N drift region to form JFET and Schottky regions with doping concentrations different than the drift layer. A schematic of a device having an n-type epitaxial layer grown over the N drift region is depicted in FIG. 1C. According to some embodiments, the epilayer can have a thickness of 0.2 μm to 3.0 μm. According to some embodiments, the doping concentration of the epilayer can be $5 \times 10^{15}$ to $1.0 \times 10^{17}$ cm$^{-3}$. This epilayer region can have a doping concentration that is higher or lower than the drift region doping concentration to help tune the performance of the Schottky region and/or the JFET region of the MOSFET.

Figure 1D:
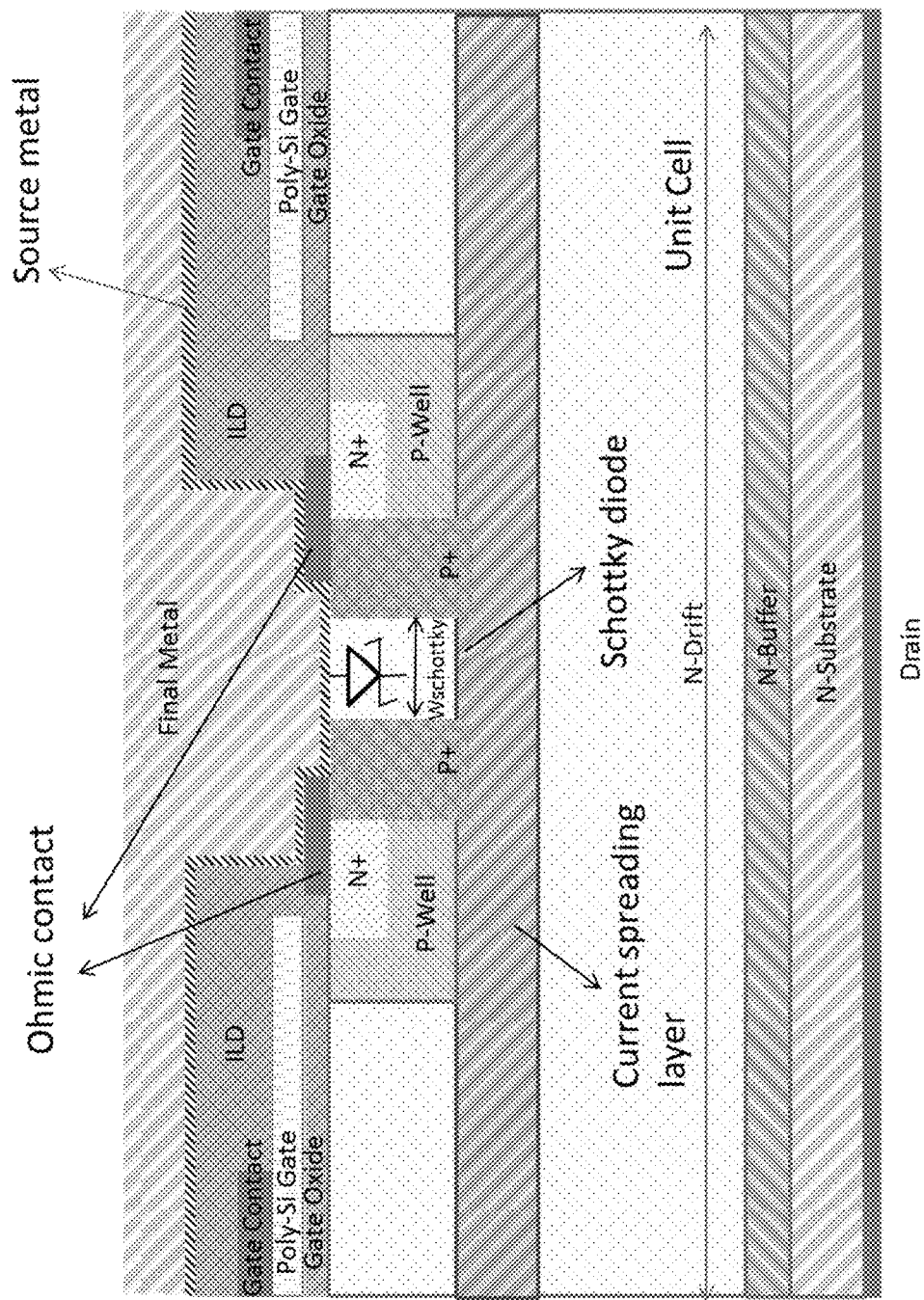
FIG. 1D is a schematic cross-sectional view of a MOSFET semiconductor device comprising an integrated Schottky diode and a current spreading layer on the drift layer.

FIG. 1D is a schematic cross-sectional view of a MOSFET semiconductor device according to some embodiments comprising an integrated Schottky diode and a current spreading layer on the drift layer. The current spreading layer can spread the current flowing from the JFET region toward the drain enabling a reduction in the JFET resistance. The doping concentration of the current spreading layer can be $5 \times 10^{15}$ to $5.0 \times 10^{17}$ cm$^{-3}$.

As shown in FIG. 1, the device can have a single continuous n-type Schottky region between the adjacent body contact (P+) regions. As also shown in FIG. 1, the upper surfaces of the JFET region may be aligned with the upper surfaces of the source and/or Schottky regions and the gate oxide is on the upper surface of the JFET region.

In FIGS. 1B, 1C and 1D a single source metal layer is shown over the Schottky region and over the source ohmic contact regions. For these embodiments, the metal over the Schottky region can also be different than the metal over the source regions as shown in FIG. 1A.

Figure 2:
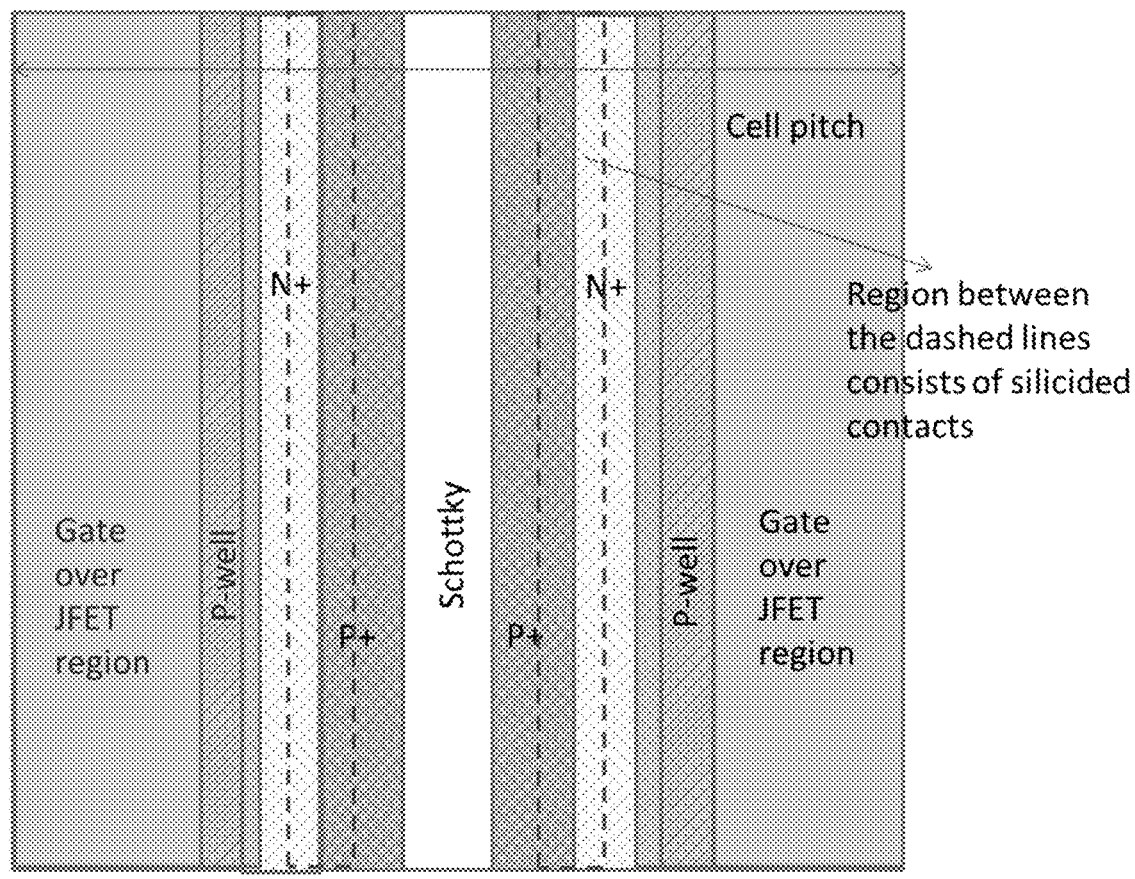
FIG. 2 is a schematic layout (i.e. top) view of a multi-cell MOSFET semiconductor device comprising an integrated Schottky diode as set forth in FIGS. 1A-1C.

FIG. 2 is a schematic showing the layout (i.e., top) view of a device as depicted in FIGS. 1A-1C. As shown in FIG. 2, the region between the dashed lines represents the source ohmic contacts. The cell pitch (i.e., the distance between the centers of the JFET regions of adjacent MOSFET devices) is also indicated in FIG. 2.

The source metallization may consist of one or more conducting layers including, but not limited to, Titanium, Titanium Nitride, Aluminum, Tungsten and combinations thereof.

According to some embodiments, the same source metallization layer or layers can be used to contact the source ohmic contacts, to form Schottky contacts and to serve as final source metallization for wire bonding and assembly processes.

Figure 3:
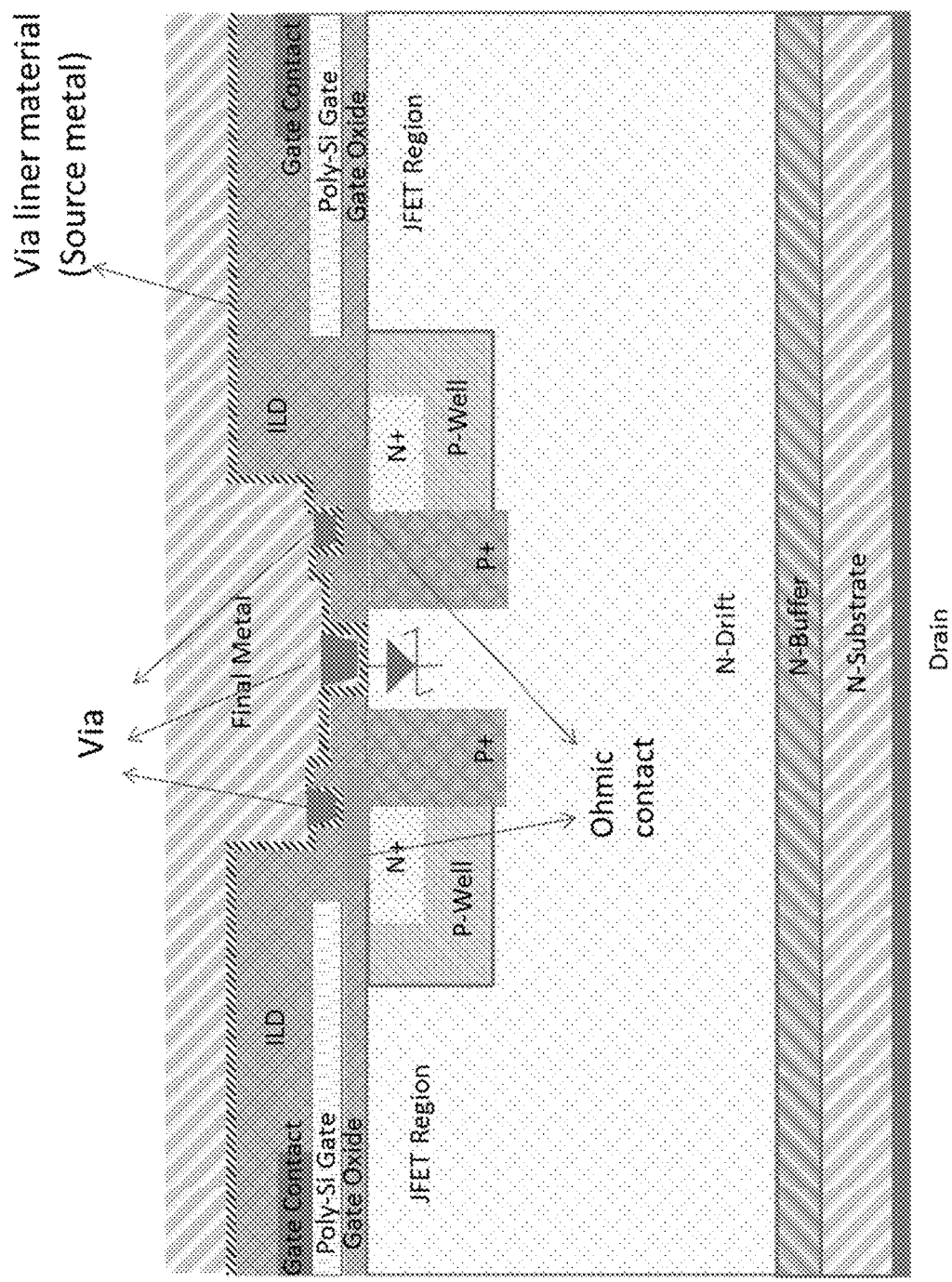
FIG. 3 is a schematic cross-sectional view of a multi-cell MOSFET semiconductor device comprising an integrated Schottky diode and having vias formed through dielectric material over the source ohmic contacts and Schottky region of the device wherein source metal contacts the source ohmic contacts and the Schottky region at the bottom of the vias.

FIG. 3 is a schematic showing the cross-section of a MOSFET device comprising an integrated Schottky diode wherein one or more vias are used to make electrical connection between the source ohmic contacts and the source final metallization in the MOSFET. As shown in FIG. 3, one or more vias can also be used to make electrical connection between the source metal (i.e., source liner) and the source final metallization. In particular, a dielectric material can be formed over the JFET region and over the source ohmic contacts. The dielectric material can be the same material used to form the interlayer dielectric layer (ILD) of the MOSFET. Vias can then be formed through the dielectric material over the source ohmic contacts and over the JFET region. The source metal lines the vias and contacts the source ohmic contacts and the Schottky region at the bottom of the vias.

As shown in FIG. 3, a via liner material (i.e., a source metal layer) contacts the source ohmic contacts at the bottom of the source vias. As also shown in FIG. 3, the via liner material (i.e., source metal) contacts the Schottky region at the bottom of the via over the Schottky region to form the Schottky diode. According to some embodiments, the via liner material comprises Titanium (Ti) and Titanium Nitride (TiN). According to some embodiments, the via is either fully or partially filled with a via filler material. According to some embodiments, the via filler material is Tungsten (W). The deposition of the via liner material and the filling of the via with Tungsten can be done using a standard Tungsten (W) plug process.

According to some embodiments, the width of the full JFET region is 1.5 μm to 6 μm, the width of the P+ regions surrounding the Schottky region is 0.6 μm to 3 μm and/or the width of the Schottky region is 1 μm to 4 μm.

Figure 4:
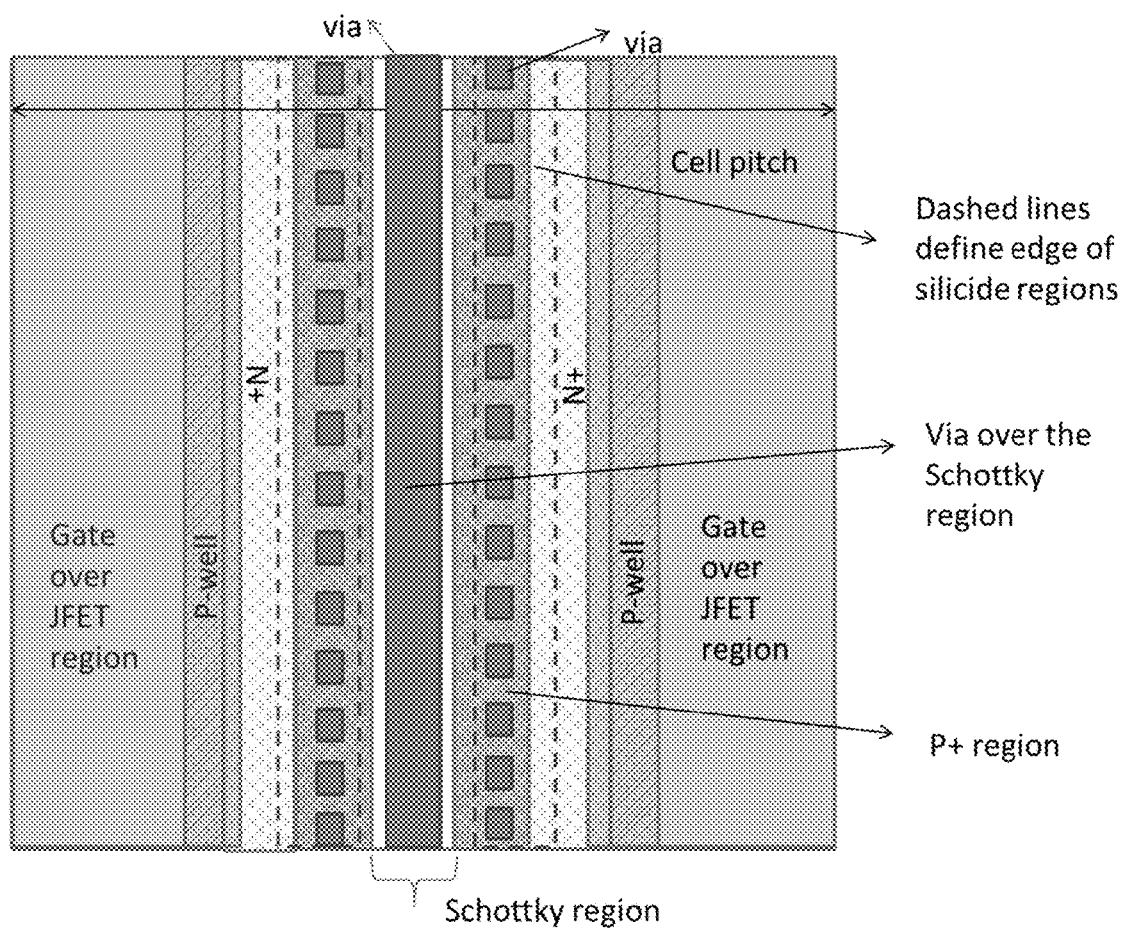
FIG. 4 is a schematic layout (i.e. top) view of a multi-cell MOSFET semiconductor device as depicted in FIG. 3 comprising a plurality of source vias arranged in a row over each of the source ohmic contacts and a single elongate Schottky via over the Schottky region.

FIG. 4 is a schematic showing the layout (i.e., top) view of a device as depicted in FIG. 3 comprising a single continuous via in the Schottky region and a plurality of separate discontinuous vias over the source ohmic contacts arranged in a column. Although rectangular source vias are shown over the source ohmic contact region, the source vias can be any shape, including but not limited to, square and rectangular in shape. When square or rectangular source vias are used, the typical dimensions of the vias are 0.5 μm×0.5 μm to 1 μm×1 μm. The via to via spacing over the source ohmic contact regions can vary depending on the process technology. According to some embodiments, via to via spacing can range from 0.5 μm to 1 μm.

Although one column of source vias is shown over the source ohmic contact region in FIG. 4, multiple columns of source vias can also be used. As shown in FIG. 4, the via over the Schottky region can be a single elongate via extending along the length of the MOSFET cell.

Figure 5:
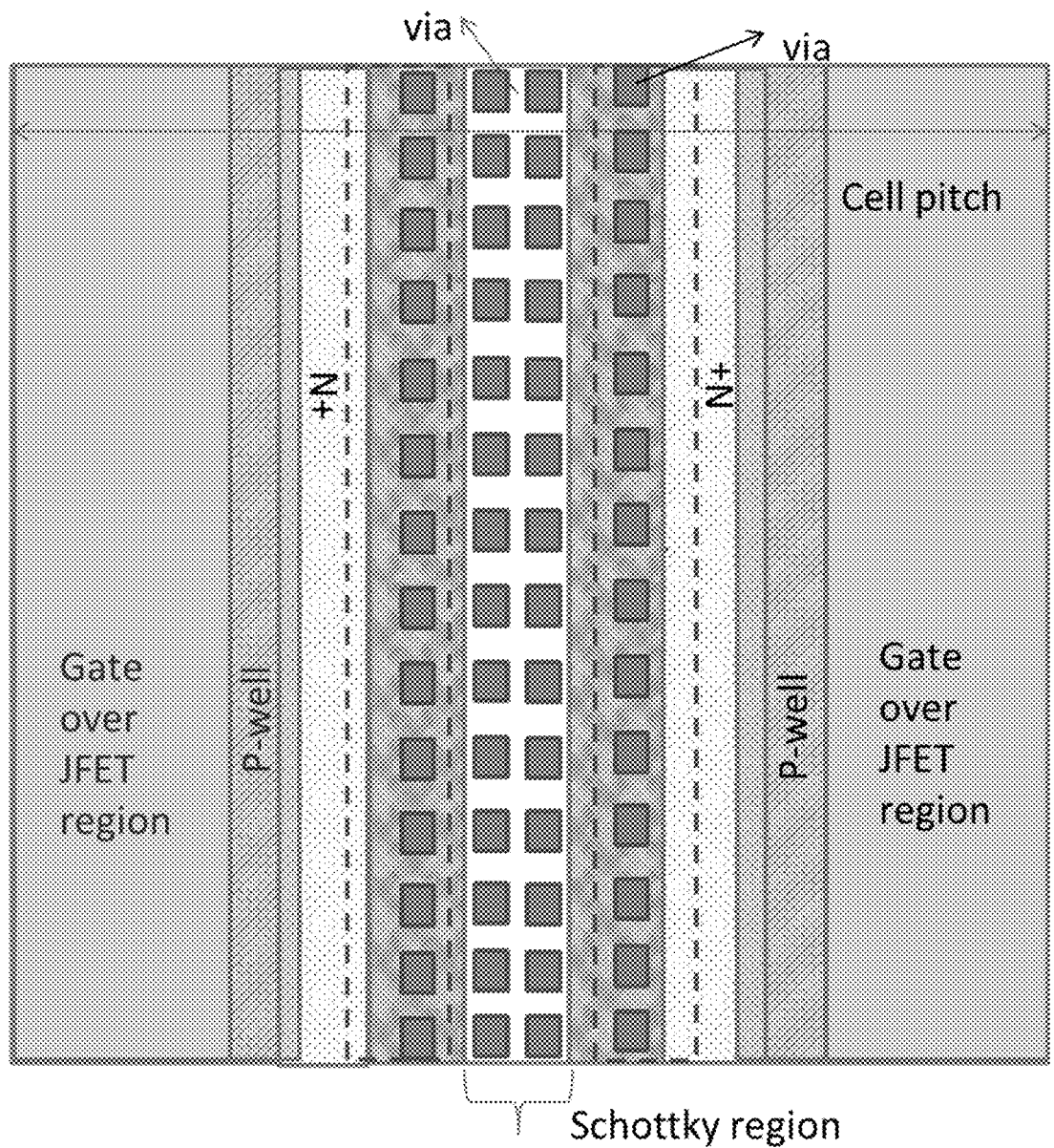
FIG. 5 is a schematic layout (i.e. top) view of a multi-cell MOSFET semiconductor device as depicted in FIG. 3 comprising a plurality of source vias arranged in a row over each of the source ohmic contacts and a plurality of Schottky vias arranged in multiple rows over the Schottky region.

FIG. 5 shows the layout view of a MOSFET device as depicted in FIG. 3 comprising a plurality of source vias arranged in multiple columns in the Schottky region and a plurality of source vias arranged in a single column over each of the source ohmic contacts. The shape of the vias, the size of the vias and the via to via spacing in the source ohmic contact area and in the Schottky region can be the same as set forth above for the device depicted in FIG. 4. FIG. 5 shows two columns of vias in the Schottky region and one column of vias in the source ohmic contact region. The source ohmic contact region, the Schottky region or both can have one or multiple columns of vias. The use of the same via shape, size and via to via spacing over the ohmic contact region and Schottky region allows for a more robust via process.

According to some embodiments, the ohmic contact material can be Nickel, Titanium and Aluminum.

According to some embodiments, the source vias are square or rectangular in shape.

According to some embodiments, the MOSFET device comprises a plurality of vias arranged in one or more columns over the source ohmic contacts and a single elongate via over the Schottky region. According to some embodiments, the MOSFET device comprises a plurality of vias arranged in one or more columns over the source ohmic contacts and a plurality of vias arranged in one or more columns of over the Schottky region.

Figure 6:
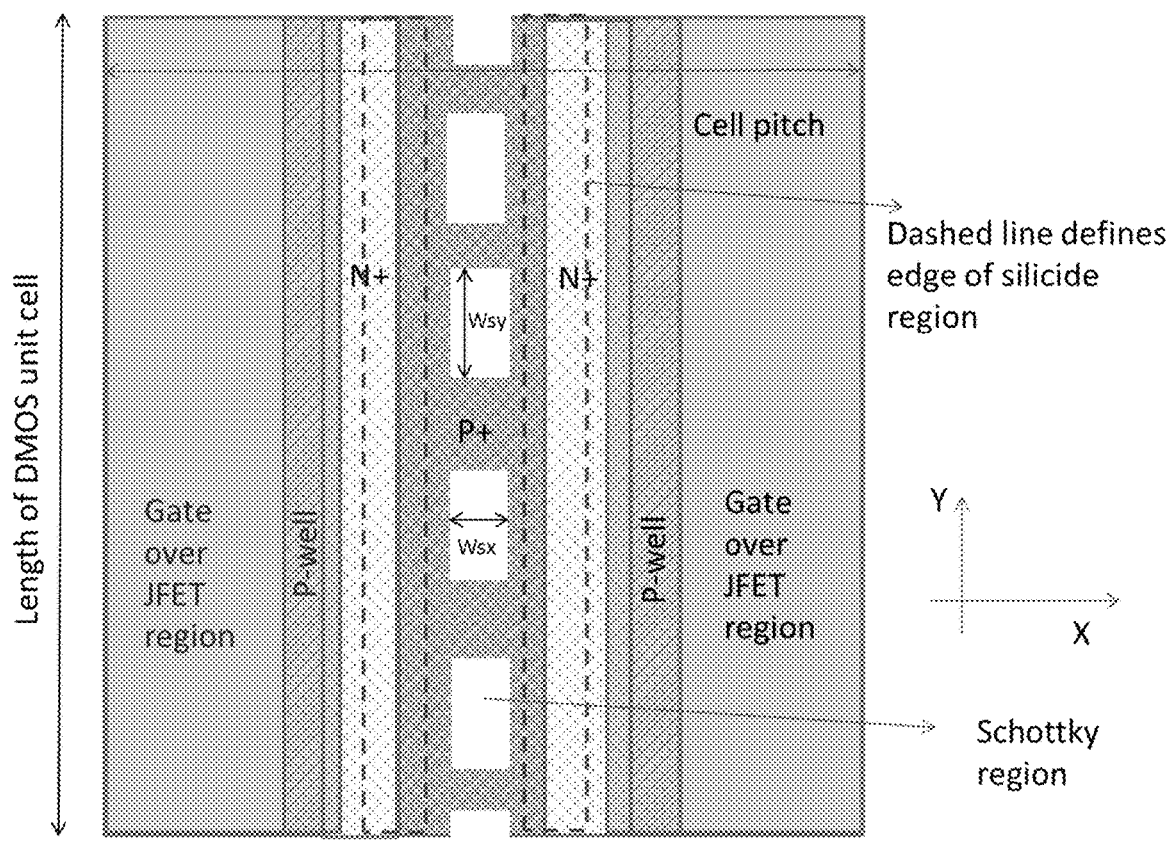
FIG. 6 is a schematic layout (i.e. top) view of a multi-cell MOSFET semiconductor device as depicted in FIG. 3 comprising a plurality of discontinuous Schottky contact regions arranged in a row and surrounded by a continuous p-type body contact region.

FIG. 6 shows the layout view of a MOSFET device having an integrated Schottky diode wherein the Schottky region is not continuous along the length of the MOSFET cell. As shown in FIG. 6, the device comprises separate Schottky regions placed periodically along the length of the DMOS cell. The separate Schottky regions can be any shape, including square or rectangular (shown). As shown in FIG. 6, the Schottky regions are completely surrounded by p-type body contact material (i.e., P+ in FIG. 6).

Use of separate discontinuous Schottky regions allows independent control over the percentage of Schottky area in a MOSFET unit cell. For instance, to increase the amount of Schottky diode in the unit cell, the width of Schottky region in the Y-direction (Wsy) can remain fixed and the width of the Schottky region in the X-direction (Wsx) can be increased. The width of the Schottky regions in the Y-direction (Wsy) can be fixed at an appropriate value for the P+ regions to effectively shield the Schottky region from the high voltage.

A smaller cell pitch is possible using the layout of FIG. 6 since a single photolithographic opening is needed for implanting the p-type body contact regions compared to the two photolithographic openings required for the devices depicted in FIGS. 4 and 5. Also, depending on the dimensions of the Schottky regions, there can be improved shielding of the Schottky regions from high electric during reverse blocking due to the presence of the p-type body contact regions surrounding the Schottky regions.

The Schottky metal is deposited over the Schottky regions to form the Schottky contacts prior to the deposition of the final source metal. A via process similar to the process described above can also be used to form the Schottky contacts and or electrical contact between the source metal and the source ohmic contacts.

The source metallization of the device can also serve as the Schottky contact to the Schottky region of the device. The source metallization can comprise Titanium, Titanium Nitride, Aluminum or Tungsten. The same metallization layer or layers can be used to make electrical contact to the source ohmic contacts and to form the Schottky contact can also serve as the final source metallization for wirebonding and assembly processes.

Figure 7A:
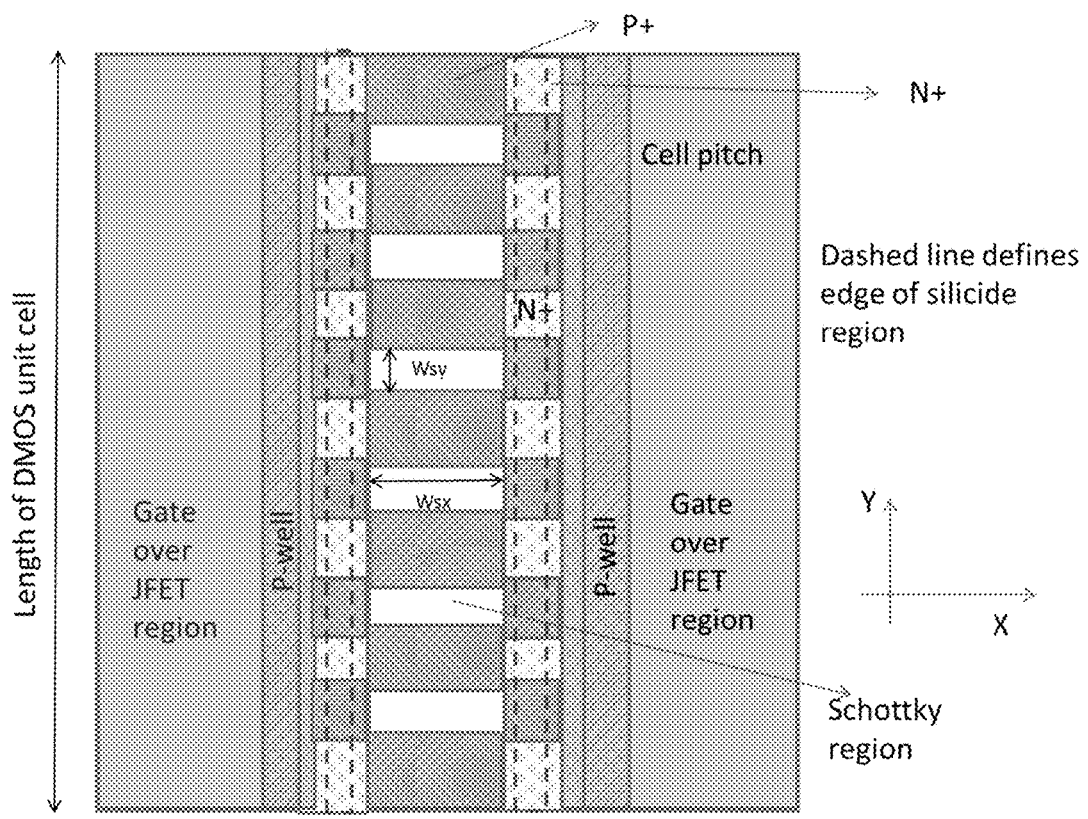
FIG. 7A is a schematic layout (i.e. top) view of a multi-cell MOSFET semiconductor device wherein the Schottky regions and the source regions each comprise a plurality of discontinuous regions alternating with discontinuous p-type body contact regions wherein the Schottky regions are adjacent p-type body contact regions in the x direction.
Figure 7B:
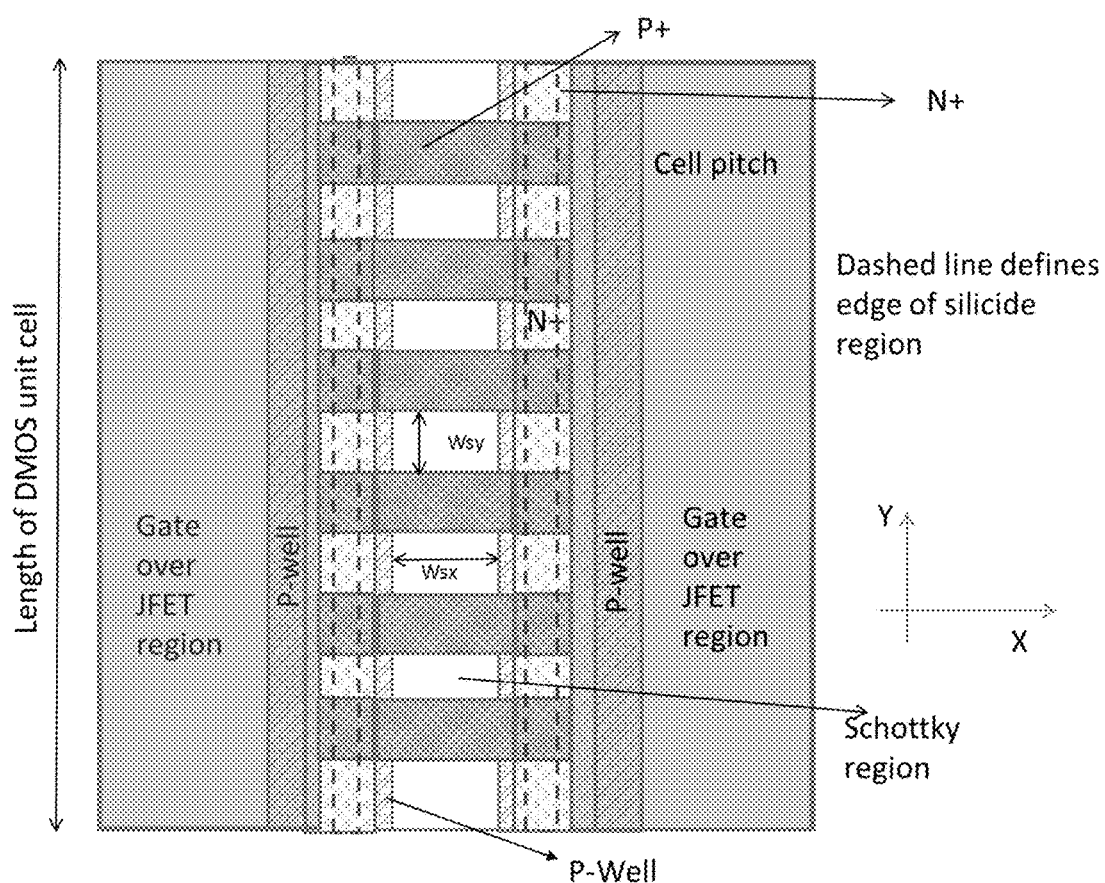
FIG. 7B is a schematic layout (i.e. top) view of a multi-cell MOSFET semiconductor device wherein the Schottky regions and the source regions each comprise a plurality of discontinuous regions alternating with discontinuous p-type body contact regions wherein the Schottky regions are adjacent source regions in the x-direction.

FIGS. 7A and 7B are schematics showing the layout view of first and second MOSFET devices having an integrated Schottky diode wherein the Schottky region and the source regions are not continuous along the length of the DMOS cell. As shown in FIG. 7A, a plurality of separate Schottky regions are placed periodically along the length of the DMOS cell. Although rectangular regions are shown, the Schottky regions can be any shape, including square or rectangular shaped. As can be seen from FIG. 7A, the source (N+) region is also not continuous along the length (i.e., y direction) of the unit cell. In particular, in the device shown in FIG. 7A, source (N+) and body contact (P+) regions are placed alternately along the length of the unit cell. Each of the separate Schottky regions is placed between body contact (P+) regions of the adjacent MOSFET cells. The Schottky regions are also surrounded by body contact (P+) regions in the y-direction. In the device shown in FIG. 7B, the separate Schottky regions of the device are between source regions (N+) rather than p-type body contact regions of adjacent MOSFETs in the x-direction. The p-type body contact regions (P+) are arranged as a single row of separate regions spaced in the y direction and extending between the p-type channel regions of adjacent MOSFET devices. The layouts depicted in FIGS. 7A and 7B allow for the Schottky area in a unit can to be independently adjusted. These layouts may also enable a smaller cell pitch compared to the device depicted in FIG. 6.

Figure 8:
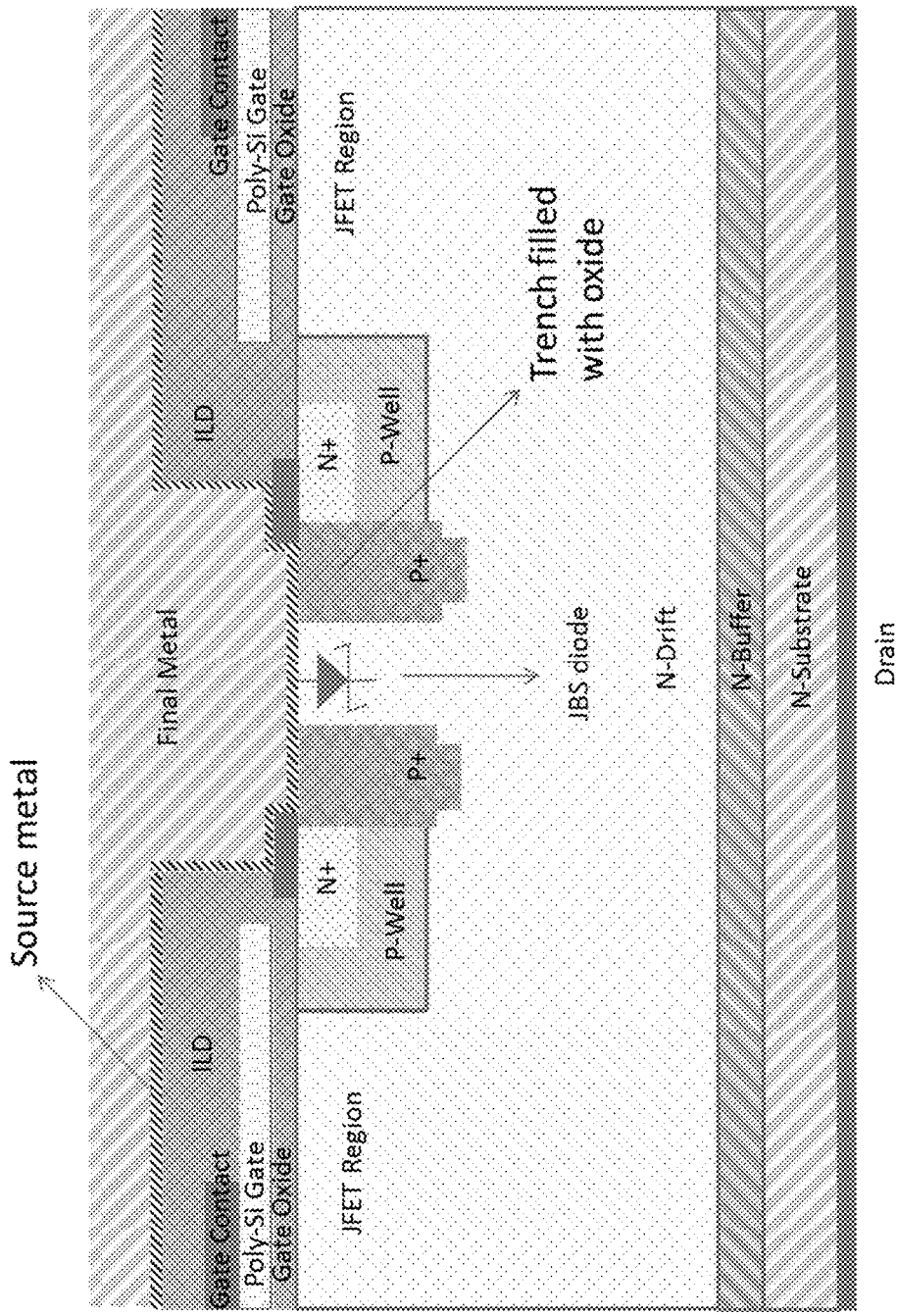
FIG. 8 is a schematic cross-sectional view of a MOSFET device having an integrated Schottky diode wherein the p-type body contact regions (P+) are formed adjacent the bottoms and sidewalls of a trench filled with oxide.

FIG. 8 is a schematic cross-sectional view of a MOSFET device having an integrated Schottky diode wherein the p-type body contact regions (P+) are formed adjacent the bottoms and sidewalls of a trench filled with a dielectric material (e.g., oxide). The p-type body contact regions can be formed via ion implantation after the trench is formed thereby resulting in a deeper p-type implant region. The deeper p-type implant region can provide better shielding of the Schottky region from the high electric when a high voltage is applied on the drain of the SiC MOSFETs. This structure also enables a higher doping concentration in the Schottky region to further lower the forward voltage drop of the diode. A lower forward voltage results in lower power loss in the diode.

Figure 9:
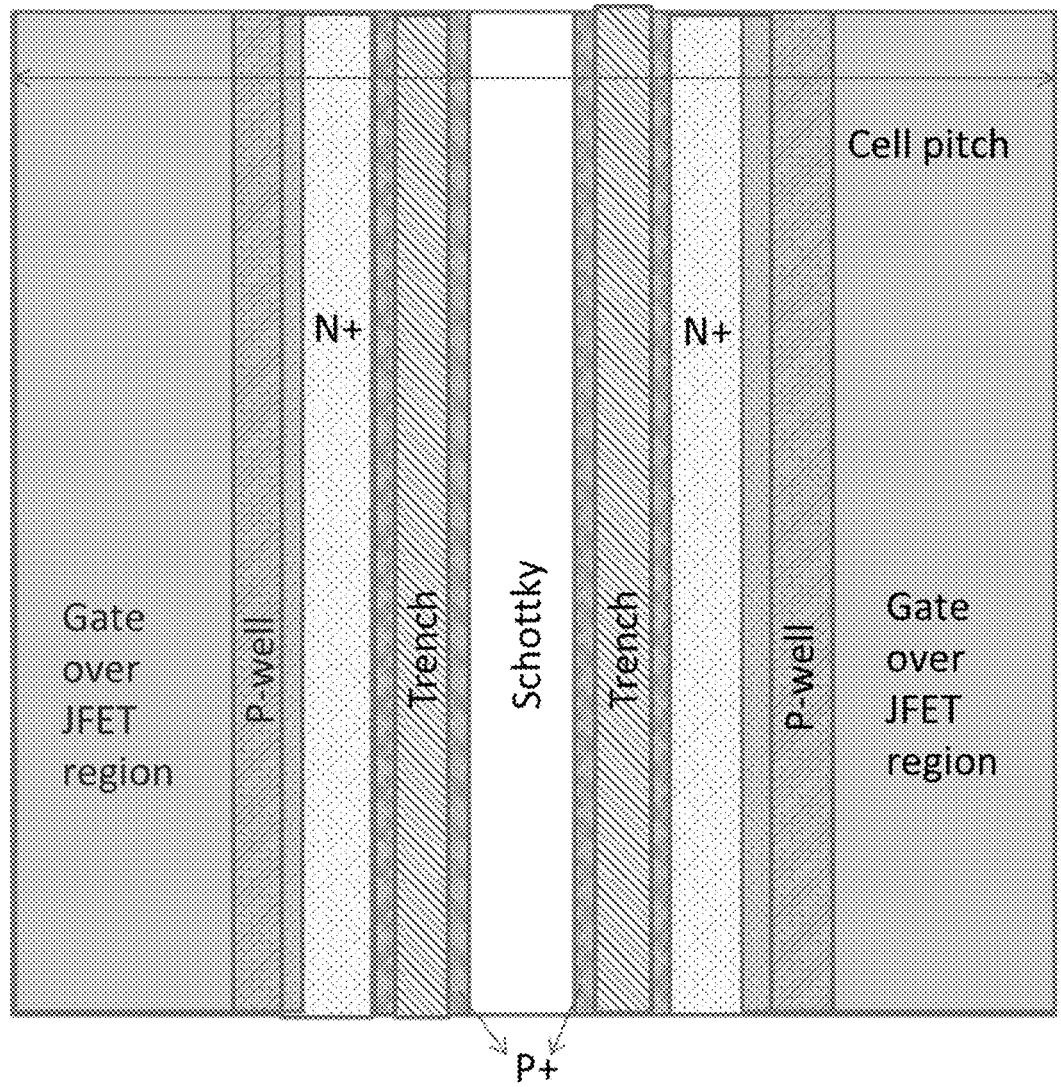
FIG. 9 is a schematic showing the layout (top) view of the device of FIG. 8.

FIG. 9 is a schematic showing the layout view of the device of FIG. 8. As can be seen from FIG. 9, the trench and the Schottky region extend along the length (i.e., y-direction) of the DMOS unit cell. The Schottky metal can be deposited over the Schottky regions prior to the deposition of the source metal as described above. The p-type body contact regions (P+) are also shown adjacent the trench in the width or x direction. The cell pitch is also shown in FIG. 9.

Figure 10:
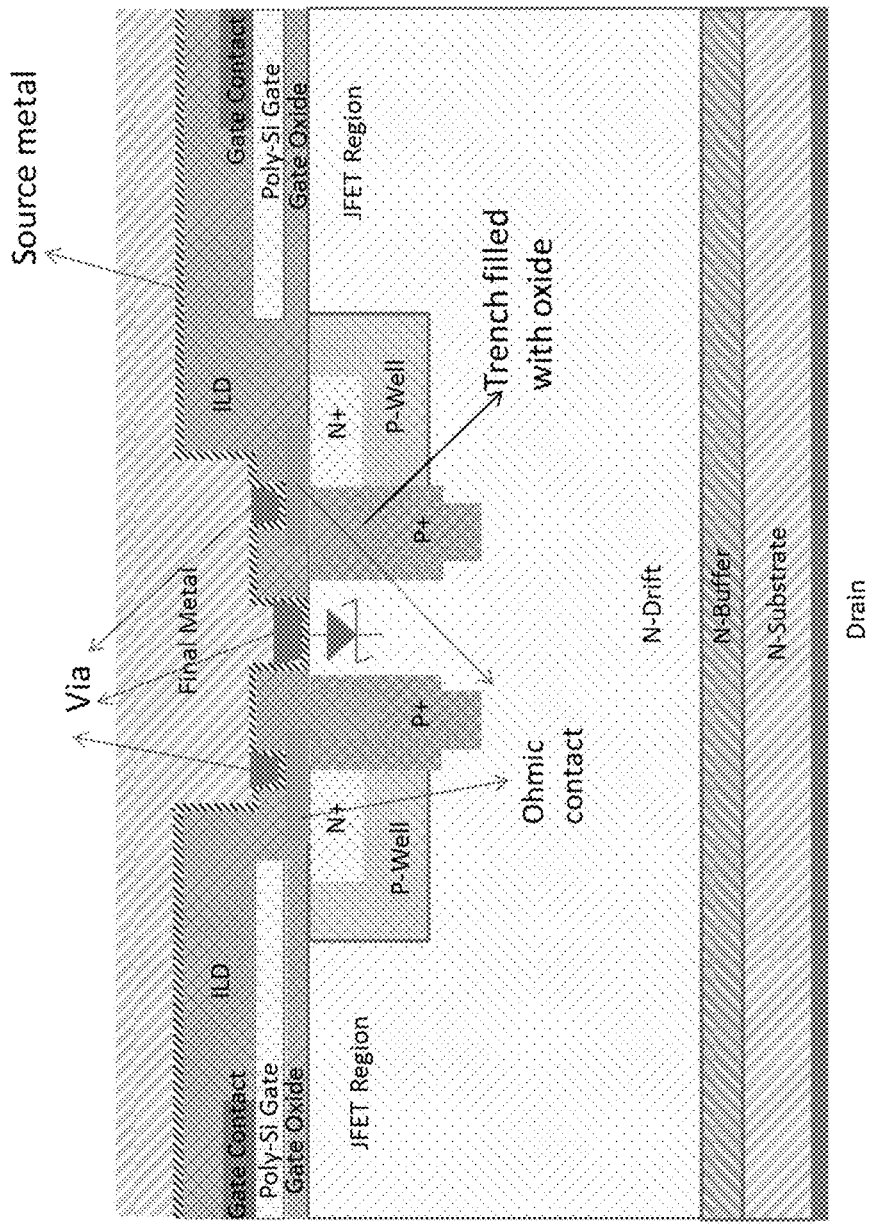
FIG. 10 is a schematic cross-sectional view of a MOSFET device having an integrated Schottky diode wherein the p-type body contact regions (P+) are formed adjacent the bottoms and sidewalls of a trench filled with oxide and wherein vias are formed through a dielectric material over the source ohmic contact and Schottky regions.

FIG. 10 is a schematic cross-sectional view of a MOSFET device having an integrated Schottky diode wherein the p-type body contact regions (P+) are formed adjacent the bottoms and sidewalls of a trench filled with oxide and wherein vias are formed over the source ohmic contact region and the Schottky regions. As shown in FIG. 10, the via liner material serves as the Schottky metal as described above.

Figure 11:
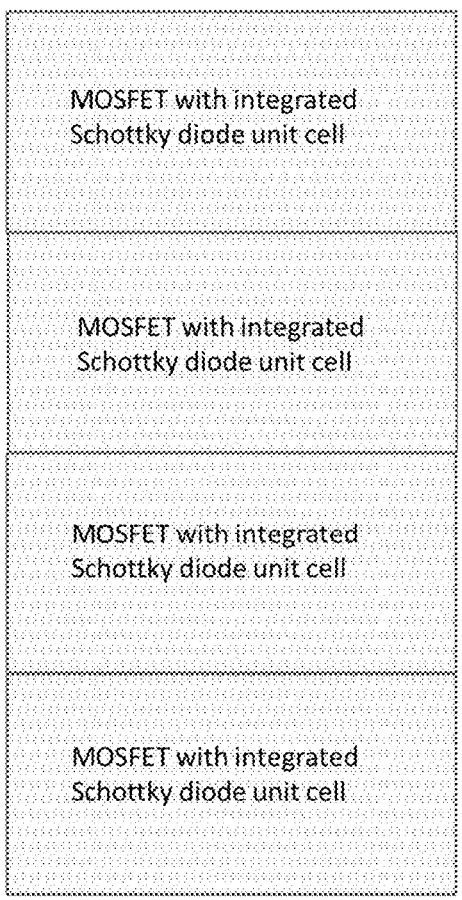
FIG. 11 is a schematic showing a multi-cell MOSFET layout comprising a plurality of MOSFETs with integrated Schottky diodes.
Figure 12:
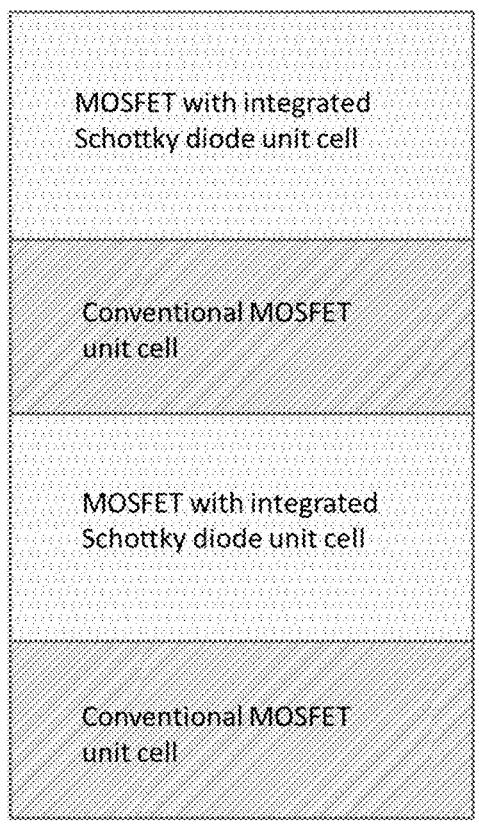
FIG. 12 is a schematic showing a multi-cell MOSFET layout comprising MOSFETs with an integrated Schottky diode alternating with MOSFETs with no integrated Schottky diode.

FIGS. 11 and 12 show layout views of different arrangements of multi-cell MOSFET devices comprising MOSFETs with integrated Schottky diodes. In FIG. 11, the multi-cell MOSFET layout consists of unit cells of MOSFETs each with integrated Schottky diodes. In FIG. 12, the multi-cell MOSFET layout comprises MOSFETs with integrated Schottky diode and MOSFETs with no integrated Schottky diode. While FIG. 12 shows alternating unit cells of MOSFETs with and without integrated Schottky diodes, other arrangements of these unit cells can also be used. For example, every second, third, etc. unit cell can be a unit cell with or without an integrated Schottky diode.

Figure 13A:
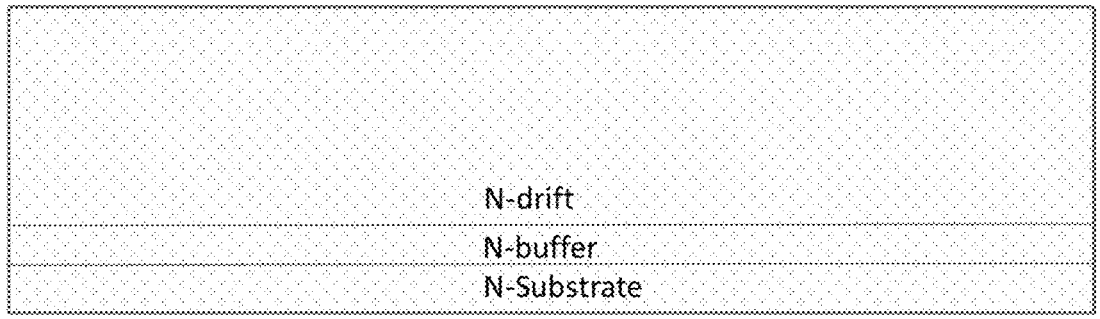
FIGS. 13A through 13I are schematics illustrating a method of making a multi-cell MOSFET device with an integrated Schottky diode as depicted in FIG. 3.

FIGS. 13A through 13I are schematics illustrating a method of making a multi-cell MOSFET device with an integrated Schottky diode as depicted in FIG. 3. As shown in FIG. 13A, the starting material comprises an N-type drift region over an N-type substrate. N-drift thickness can vary from a few micrometers (e.g., 2 μm) to over 100 micrometers. The substrate thickness can also vary. The substrate can have a thickness of 350 micrometers. An n-type buffer layer is also shown between the n-type drift layer and the substrate. The buffer layer is optional and the drift layer can be formed directly on the substrate.

Figure 13B:
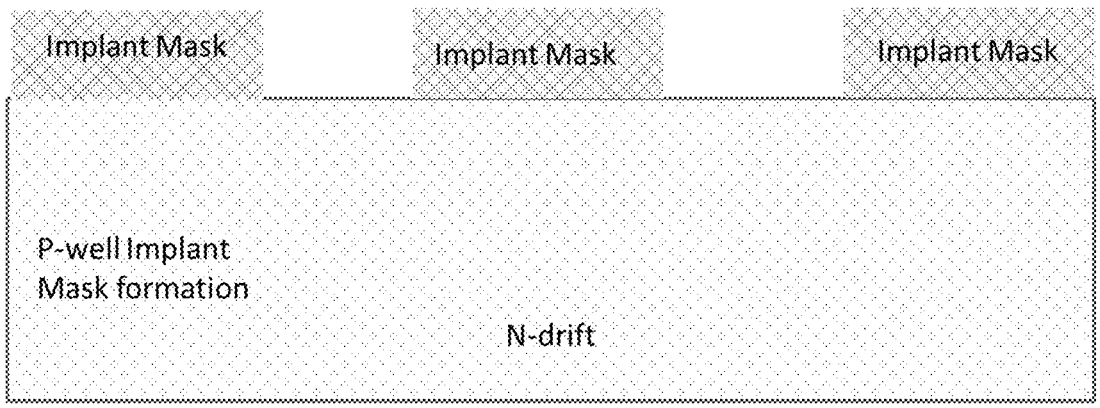
Figure 13C:
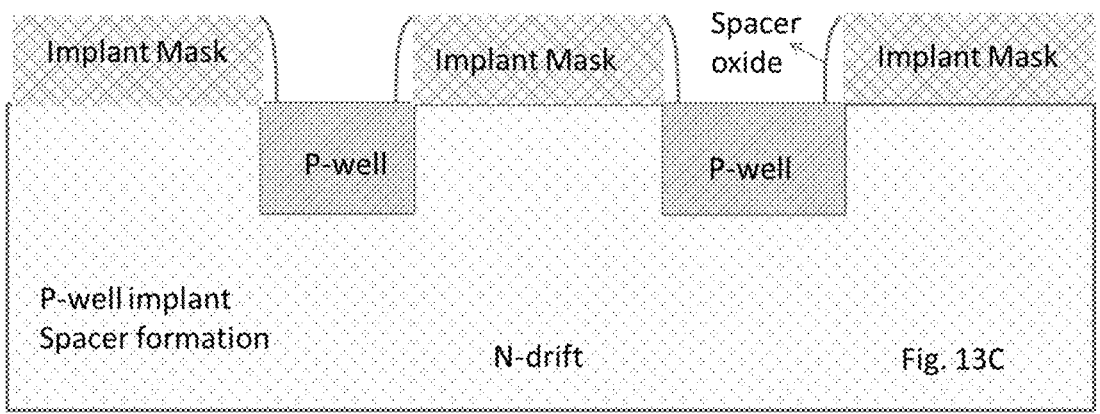
Figure 13D:
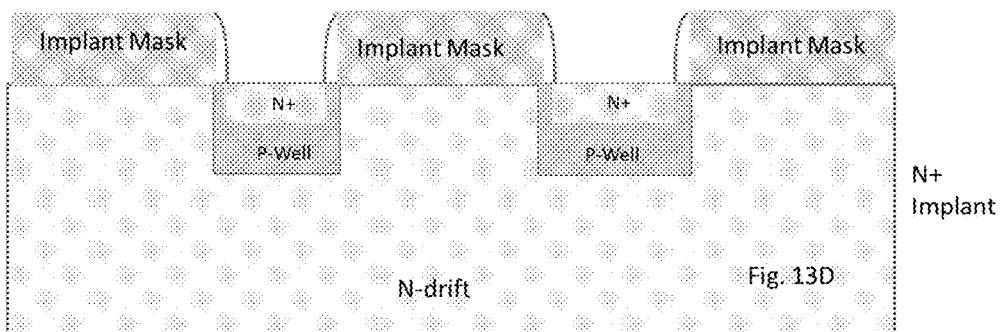

As shown in FIG. 13B, an implant mask (e.g., silicon dioxide) is deposited, patterned and etched to define the openings for the P-well implant. The P-type wells are then implanted in the drift layer. As shown in FIG. 13C, after P-well implantation a layer of mask material (e.g., silicon dioxide) is deposited and etched back to define spacers on the edges of the P-well implant masking material. As shown in FIG. 13D, N+ implantation is then performed to define the N+ source regions. The spacers offset the source regions from the edge of the p-type well regions thereby defining p-type channels between the source regions and the adjacent JFET regions.

Figure 13E:
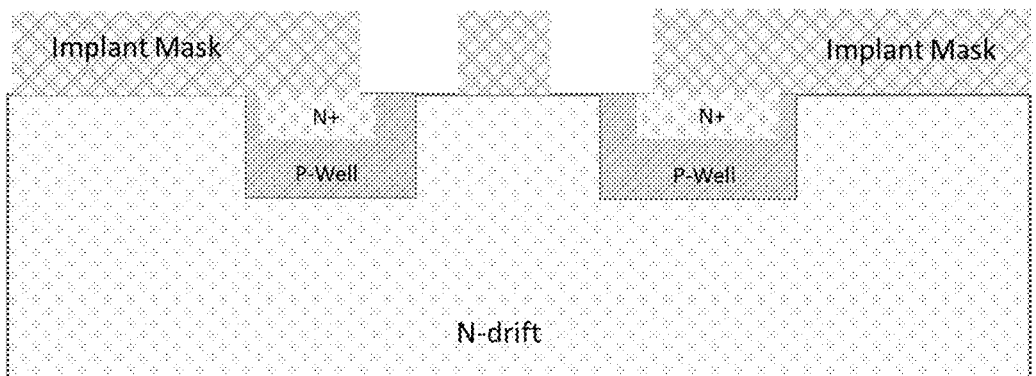
Figure 13F:
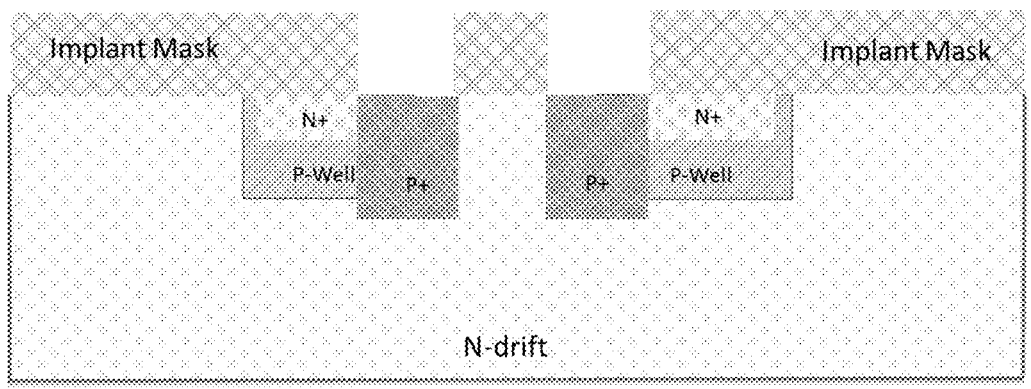
Figure 13G:
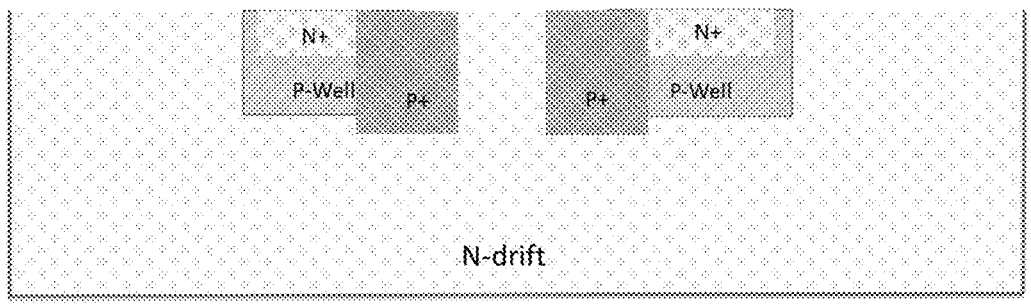

As shown in FIG. 13E, an implant mask (e.g., silicon dioxide) is then deposited, patterned and etched to define the openings for the P+ implant. The P+ region serves as the body contact for the MOSFET. The body contact regions are then formed as shown in FIG. 13F. After removal of the implant mask as shown in FIG. 13G, the implants can then be activated through anneals at high temperature (e.g., 1650° C.).

Figure 13H:
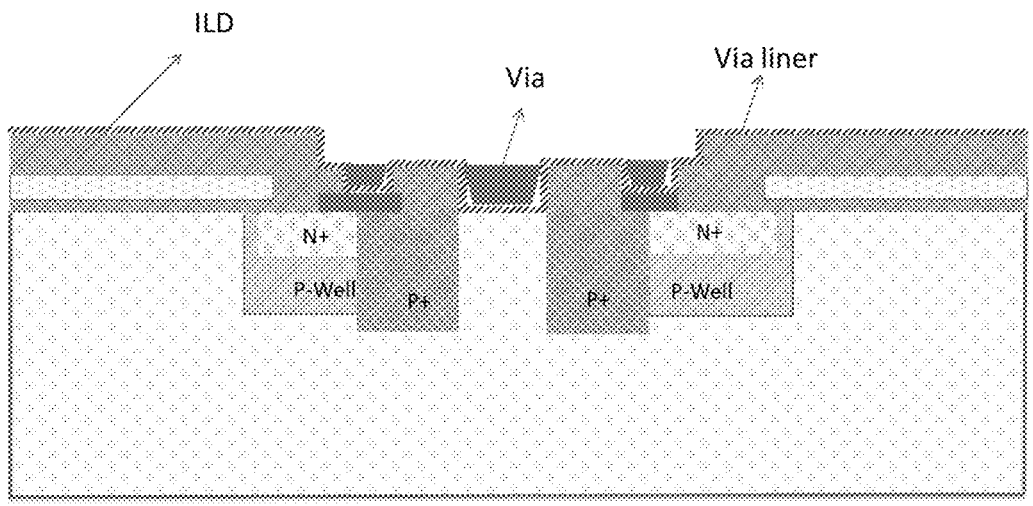
Figure 13I:
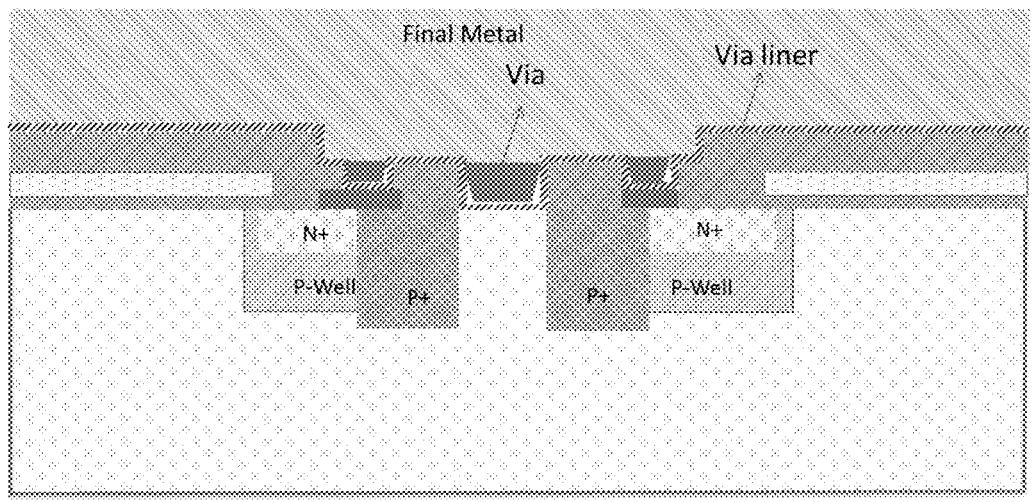

The gate oxide can then be formed followed by polysilicon gate deposition, patterning and etching and inter level dielectric (e.g., silicon dioxide) deposition, patterning and etching. Source ohmic contacts can then be formed, etched and annealed. A dielectric material (e.g., silicon dioxide) is then deposited over the source ohmic contacts, p+ regions and Schottky regions and patterned and etched to form source and Schottky vias. Then a source metal/via liner material is deposited. Electrical contact is made to the ohmic contacts through the via liner material. The via liner material also contacts the Schottky region to form the Schottky contact. This material can be a layer of Titanium (Ti) and Titanium Nitride (TiN). The vias are then filled with a via filler material (e.g., Tungsten). The device after these process steps is shown in FIG. 13H. The final source metal (e.g., Aluminum) can then be deposited. The device after these process steps is shown in FIG. 13I.

The process shown in FIGS. 13A-13I with minor modifications can be used to produce a device without vias over the source and Schottky regions as depicted in FIGS. 1A-1C. The buffer and substrate layers are not shown in FIGS. 13B-13I.

Figure 14A:
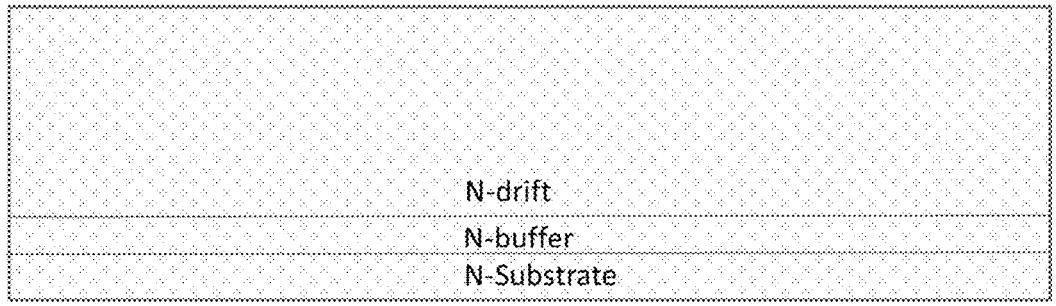
FIGS. 14A through 14K are schematics illustrating a method of making a multi-cell MOSFET device with an integrated Schottky diode as depicted in FIG. 8.

FIGS. 14A through 14K are schematics illustrating a method of making a multi-cell MOSFET device with an integrated Schottky diode as depicted in FIG. 8. As shown in FIG. 14A, the starting material can be an N-type drift region over an N-substrate. The thickness of the n-type drift layer can vary and exemplary thicknesses range from a 2 micrometers to over 100 micrometers. The substrate thickness can also vary. An exemplary substrate thickness is 350 micrometers. An optional n-type buffer layer can be used between the substrate and drift layers.

Figure 14B:
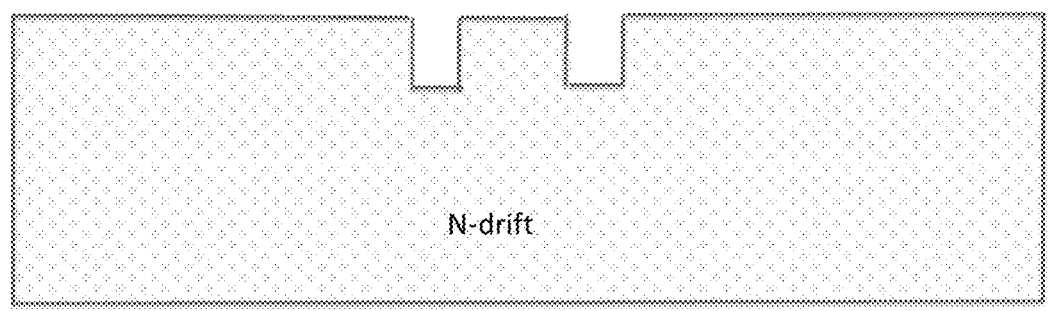
Figure 14C:
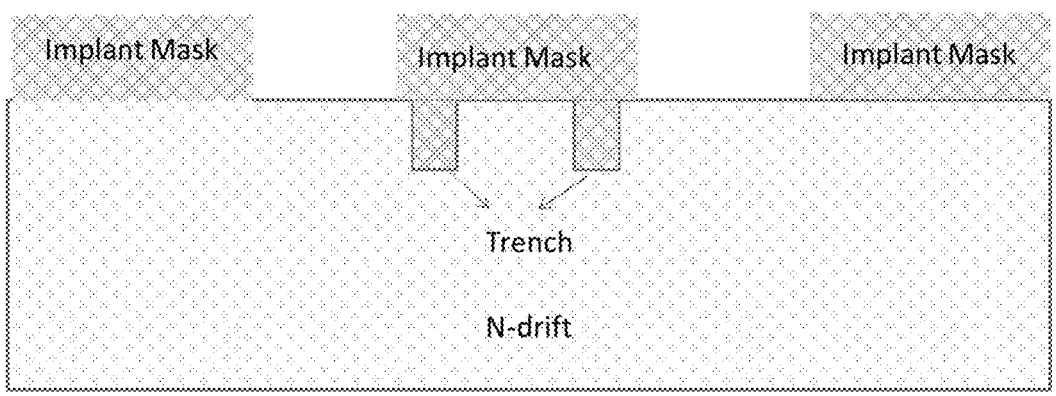
Figure 14D:
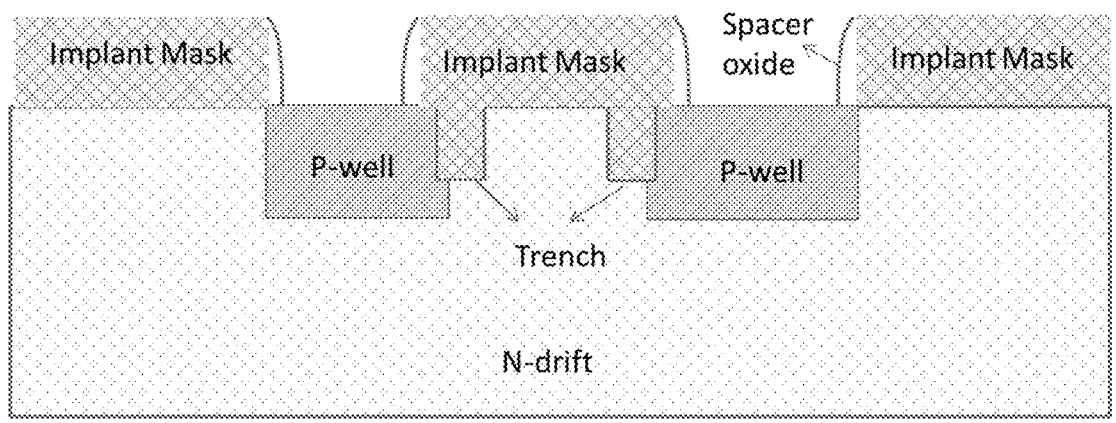

As shown in FIG. 14B, trenches are anisotropically etched in the n-type drift layer. The trenches can be defined using the same etch process used to define the alignment marks needed for photolithographic processes. As shown in FIG. 14C, an implant mask (e.g., silicon dioxide) is deposited, patterned and etched to define the openings for the P-well implant. The P-well regions are then implanted in the drift layer. As shown in FIG. 14D, after P-well implantation, a layer of masking material (e.g., silicon dioxide) is deposited and anisotropically etched back to define spacers on the edges of the P-well implant masking oxide.

Figure 14E:
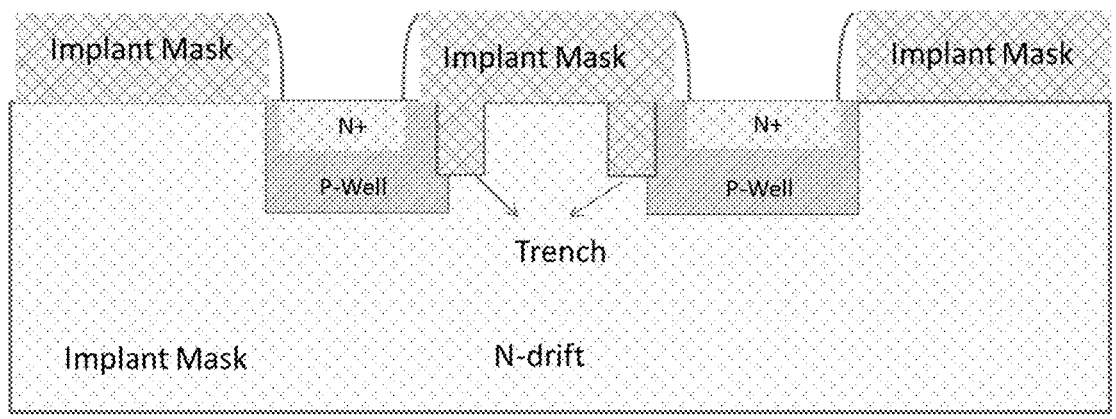

As shown in FIG. 14E, N+ implantation is then performed through openings in the mask to define the N+ source regions. The spacers allow the implanted source regions to be spaced from the edges of the p-well regions thereby defining a channel in the well regions between the source regions and the adjacent JFET region.

Figure 14F:
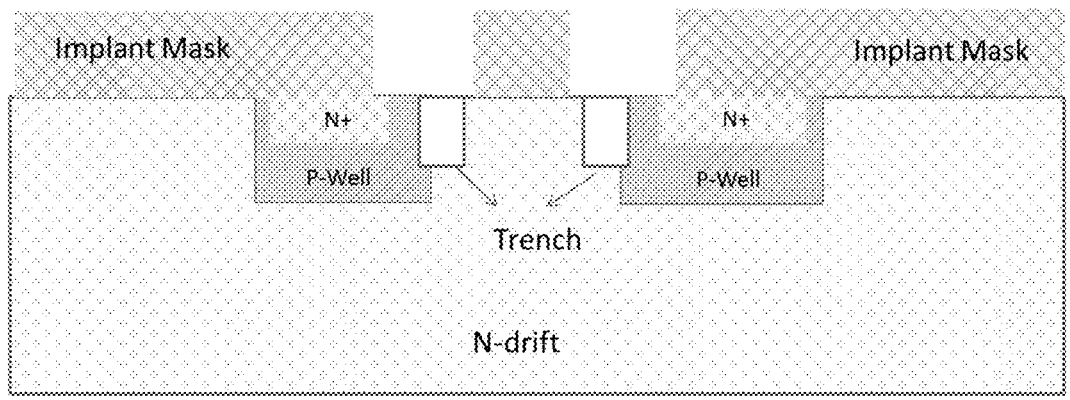
Figure 14G:
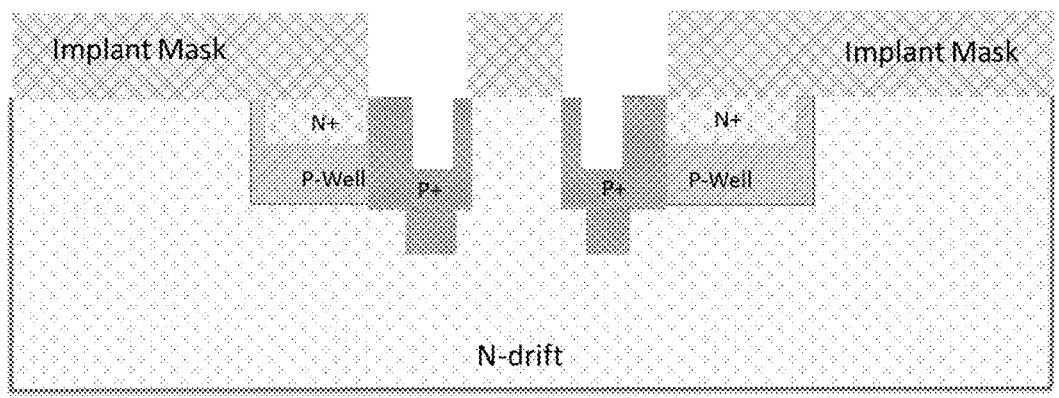

As shown in FIG. 14F, an implant masking material (e.g., silicon dioxide) is deposited, patterned and etched to define the openings for the P+ implant. The P+ region serves as the body contact region for the DMOSFET. The device after P+ implantation is shown in FIG. 14G. As can be seen from FIG. 14G, the P+ implant is deeper below the trench.

Figure 14H:
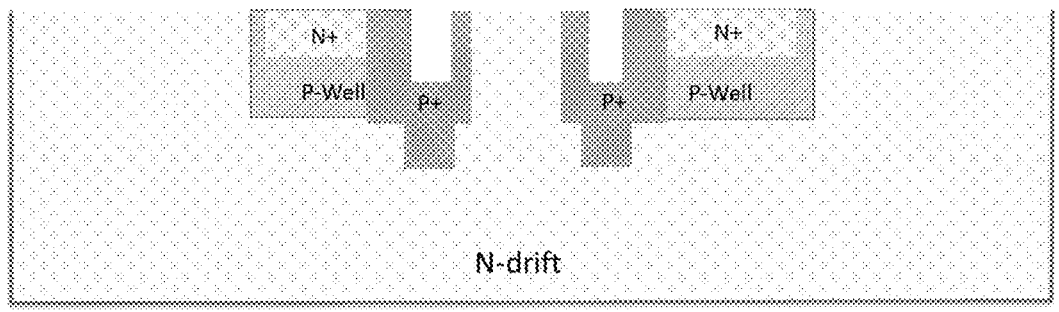
Figure 14I:
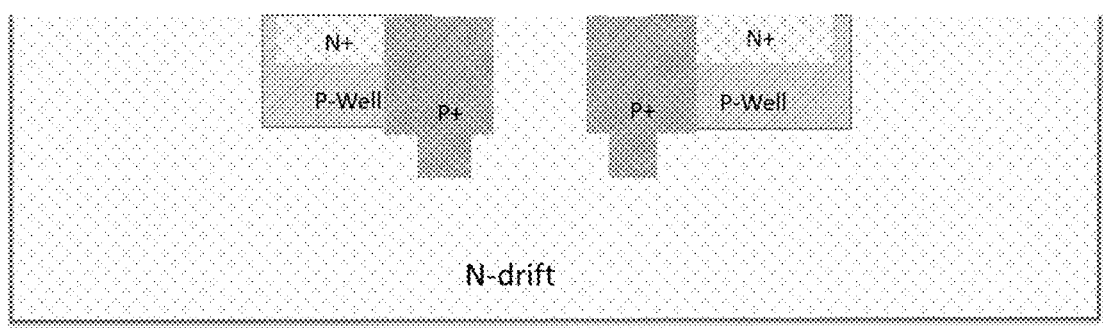

FIG. 14H shows the device after removal of the implant mask. At this stage of the process, the implants can be activated by annealing at high temperature (e.g., 1650° C.). FIG. 14I shows the device after implant activation anneal. As shown in FIG. 14I, the trenches have been filled with silicon dioxide and planarized. The oxide and planarization can be done using the well-established deposition (e.g., chemical vapor deposition) and polishing processes (for example chemical mechanical polishing or dry etch planarization).

Figure 14J:
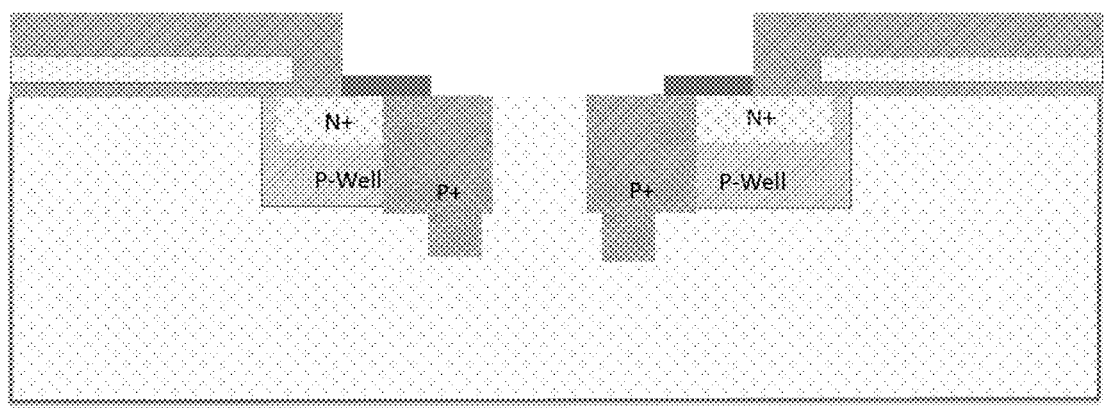

After the trenches have been filled and planarized, the gate oxide can be formed followed by polysilicon gate deposition, patterning and etching and inter level dielectric (e.g., silicon dioxide) deposition, patterning and etching. Source ohmic contacts can then be formed, etching and annealed. The device after these process steps is shown in FIG. 14J.

Figure 14K:
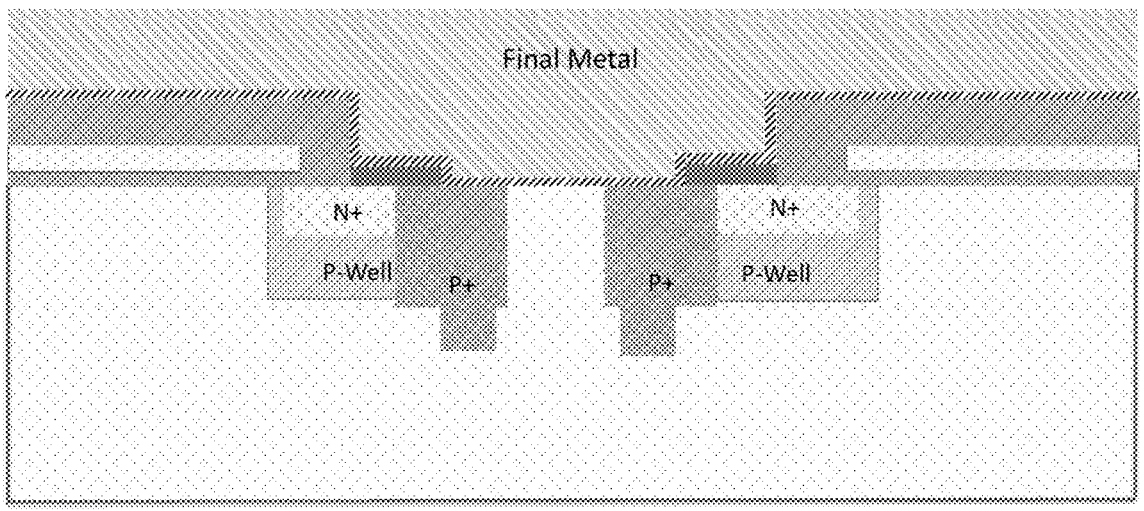

The Schottky metal (e.g., Titanium) can then be deposited followed by deposition of the final source metal (e.g., Aluminum). The device after these process steps is shown in FIG. 14K.

The buffer and substrate layers are not shown in FIGS. 14B-14K.

Figure 15:
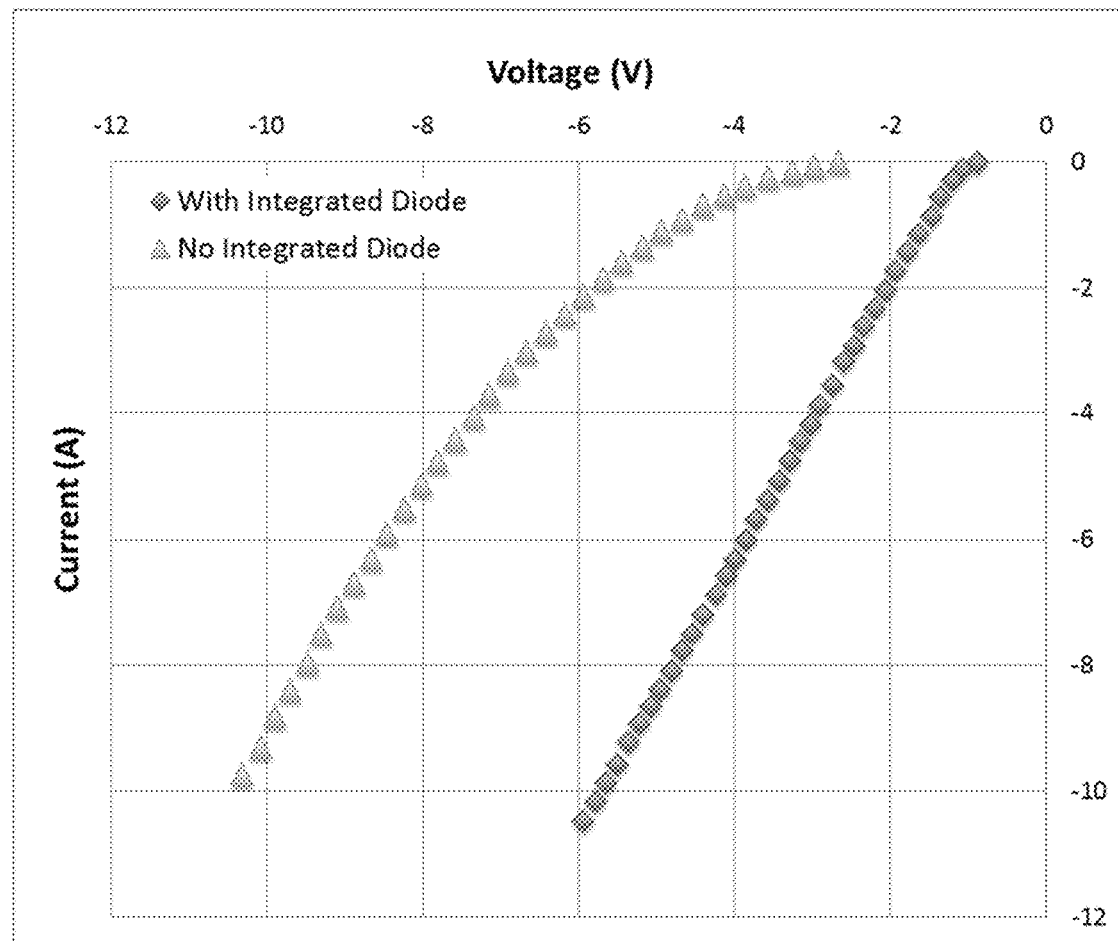
FIG. 15 is a graph showing the operation of a DMOS with integrated Schottky as described herein (◇) compared to a conventional DMOS device without an integrated Schottky diode (Δ) operating in the 3rd quadrant with gate-source voltage ($V_{gs}$) of 0 V.

FIG. 15 is a graph showing the operation of a DMOS with integrated Schottky as described herein (◊) compared to a conventional DMOS device (Δ) operating in the 3rd quadrant with gate-source voltage (Vgs) of 0 V. In the 3rd quadrant, the current conduction in the conventional device is primarily through the built-in P-well to N-drift p-n junction diode. In the device described herein, the current conduction is dominated by the integrated Schottky diode. As can be seen from FIG. 15, the integrated Schottky diode has a much lower voltage drop compared to the built-in diode at any given current. The lower forward voltage drop translates to better power electronic system performance.

Figure 16:
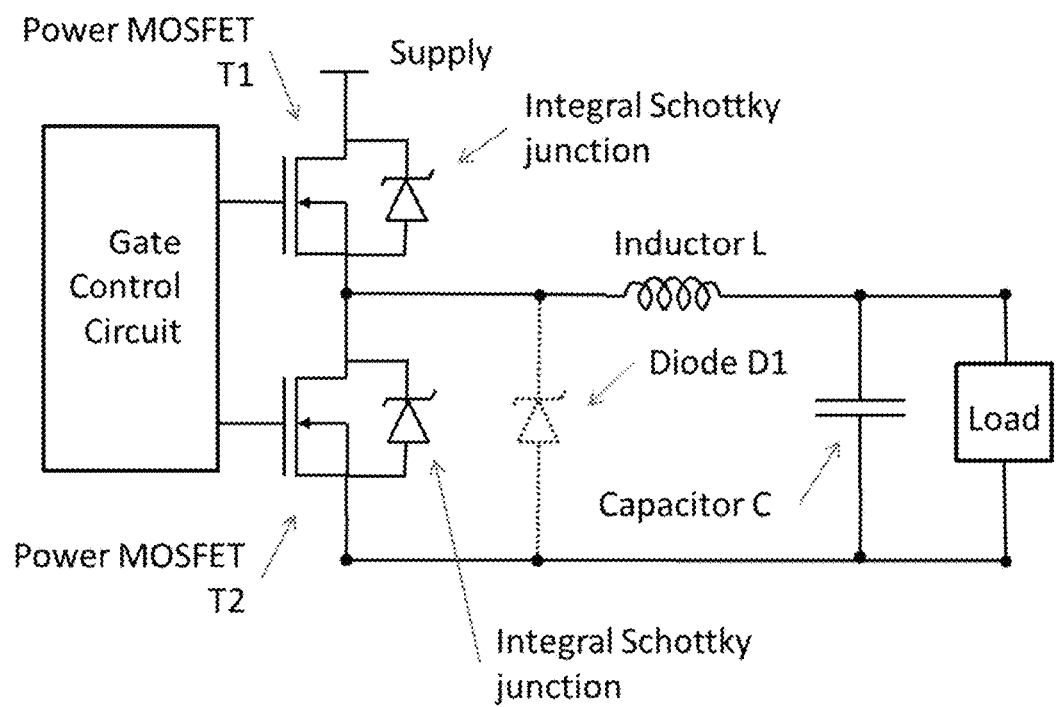
FIG. 16 is a schematic of a circuit of a DC-DC converter comprising power MOSFETs having integral Schottky diodes.

FIG. 16 is a schematic of a circuit of a DC-DC converter comprising power MOSFETs having integral Schottky diodes. As shown in FIG. 16, the circuit comprises two power MOSFETs T1 and T2 with integrated Schottky junctions as described herein. The gates of the power MOSFETs are driven by a gate control circuit to regulate the transfer of power from a supply to a load. Since the power MOSFETs have integrated Schottky junctions, freewheeling diode D1 (shown in hatched lines) is not required.

While the foregoing specification teaches the principles of the present invention, with examples provided for the purpose of illustration, it will be appreciated by one skilled in the art from reading this disclosure that various changes in form and detail can be made without departing from the true scope of the invention.

What is claimed is:
1. A multi-cell MOSFET device comprising:
    an n-type drift layer on an n-type substrate;
    a plurality of MOSFET cells, each of the MOSFET cells comprising:
        first and second p-type well regions in spaced relation on the n-type drift layer;

an n-type JFET region on the n-type drift layer between the first and second p-type well regions, wherein each of the first and second p-type well regions has a channel region adjacent the JFET region;

first and second n-type source regions on each of the first and second p-type well regions and adjacent the channel regions opposite the JFET region, wherein the first and second n-type source regions have a higher dopant concentration than the n-type drift layer;

source ohmic contacts on each of the first and second n-type source regions;

a gate dielectric layer on the JFET region and channel regions;

a gate layer on the gate dielectric layer;

an interlayer dielectric layer on the gate layer; and first and second p-type body contact regions on the n-type drift layer and adjacent the first and second n-type source regions opposite the channel regions, wherein the first and second p-type body contact regions have a higher dopant concentration than the first and second p-type well regions;

one or more n-type Schottky regions on the n-type drift layer adjacent one or more of the MOSFET cells;

a source metal layer on and in contact with the source ohmic contacts; and a Schottky metal layer on and in contact with the one or more n-type Schottky regions, the Schottky metal layer forming a Schottky contact with the one or more n-type Schottky regions; wherein each of the one or more n-type Schottky regions is adjacent and between the p-type body contact regions of adjacent MOSFET cells;

the first and second p-type well regions are elongate regions spaced from one another in an x direction and extending in a y direction perpendicular to the x direction;

the n-type JFET region is an elongate region extending in the x direction between the first and second p-type well regions;

the first and second p-type body contact regions are elongate regions extending in the y direction;

a p-type body contact region of a first of the plurality of MOSFET cells is connected to an adjacent p-type body contact regions of a second of the plurality of MOSFET cells by lateral p-type body contact regions spaced in the y-direction and extending in the x direction; and the Schottky region between the first and second MOSFET cells comprises a plurality of separate Schottky regions between the lateral p-type body contact regions in the y direction and between the p-type body contact regions of the first and second MOSFET cells in the x direction.

2. The multi-cell MOSFET device of claim 1, wherein the one or more n-type Schottky regions have a different dopant concentration than the n-type drift layer.

3. The multi-cell MOSFET device of claim 1, wherein the n-type JFET region has a different dopant concentration than the n-type drift layer.

4. The multi-cell MOSFET device of claim 1, further comprising a dielectric material over the source ohmic contacts and the one or more n-type Schottky regions, the device further comprising:

one or more source vias formed through the dielectric material over the source ohmic contacts; and one or more Schottky vias formed through the dielectric material over the one or more n-type Schottky regions;

wherein the source metal layer is on the dielectric material and in the source and Schottky vias and wherein the source metal layer contacts the Schottky regions at the bottom of the Schottky vias and the source ohmic contacts at the bottom of the source vias.

5. The multi-cell MOSFET device of claim 1, further comprising dielectric material in the first and second p-type body contact regions.

6. The multi-cell MOSFET device of claim 4, further comprising dielectric material in the first and second p-type body contact regions.

7. The multi-cell MOSFET device of claim 1, wherein the device comprises one n-type Schottky region for each of the MOSFET cells.

8. The multi-cell MOSFET device of claim 1, wherein the device comprises less than one n-type Schottky region for each MOSFET cell.

9. The multi-cell MOSFET device of claim 1, wherein the device comprises an even number of MOSFET cells and one n-type Schottky region for every two MOSFET cells.

10. The multi-cell MOSFET device of claim 1, wherein the device is a SiC device.

* * * * *